(12) United States Patent
Yang et al.

(10) Patent No.: US 11,897,784 B2
(45) Date of Patent: Feb. 13, 2024

(54) PEROVSKITE MATERIALS FOR IONIZING RADIATION DETECTION AND RELATED METHODS

(71) Applicant: North Carolina State University, Raleigh, NC (US)

(72) Inventors: Ge Yang, Raleigh, NC (US); Zheng Zhang, Raleigh, NC (US)

(73) Assignee: NORTH CAROLINA STATE UNIVERSITY, Raleigh, NC (US)

( * ) Notice: Subject to any disclaimer, the term of this patent is extended or adjusted under 35 U.S.C. 154(b) by 226 days.

(21) Appl. No.: 17/644,886

(22) Filed: Dec. 17, 2021

(65) Prior Publication Data

US 2022/0195297 A1 Jun. 23, 2022

Related U.S. Application Data

(60) Provisional application No. 63/127,261, filed on Dec. 18, 2020.

(51) Int. Cl.
| | |
|---|---|
| *C01G 29/00* | (2006.01) |
| *C09K 11/74* | (2006.01) |
| *C30B 29/12* | (2006.01) |
| *C30B 7/14* | (2006.01) |
| *G01T 1/16* | (2006.01) |

(52) U.S. Cl.
CPC ........ *C01G 29/006* (2013.01); *C09K 11/7435* (2013.01); *C30B 7/14* (2013.01); *C30B 29/12* (2013.01); *G01T 1/16* (2013.01); *C01P 2002/34* (2013.01); *C01P 2002/72* (2013.01); *C01P 2002/74* (2013.01); *C01P 2002/77* (2013.01); *C01P 2002/88* (2013.01); *C01P 2004/02* (2013.01); *C01P 2006/40* (2013.01); *C01P 2006/80* (2013.01); *C01P 2006/90* (2013.01)

(58) Field of Classification Search
CPC ..... C09K 11/7435; C01G 29/006; C30B 7/14; C30B 29/12; G01T 1/16
See application file for complete search history.

(56) References Cited

U.S. PATENT DOCUMENTS

| | | | |
|---|---|---|---|
| 2019/0019905 A1* | 1/2019 | Tang | H01L 31/032 |
| 2021/0175451 A1* | 6/2021 | Chen | H10K 71/441 |

OTHER PUBLICATIONS

Ali, R., et al. (2018). Predicted lead-free perovskites for solar cells. Chemistry of Materials, 30(3), 718-728.

(Continued)

*Primary Examiner* — Hugh Maupin
(74) *Attorney, Agent, or Firm* — THOMAS | HORSTEMEYER, LLP

(57) ABSTRACT

In accordance with the purpose(s) of the present disclosure, as embodied and broadly described herein, the disclosure, in one aspect, relates to compound Bi-poor perovskite crystals, methods for making the same, and ionizing and other electromagnetic radiation detectors constructed using the Bi-poor perovskite crystals. The Bi-poor perovskite crystals can be synthesized using melt-based growth methods and solution-based growth methods and contain no toxic heavy metals such as lead, cadmium, thallium, or mercury. Devices fabricated from the crystals maintain acceptable levels of performance over time. In some aspects, post-growth annealing can be used to improve the properties, including, but not limited to, room temperature resistivity and response to radiation.

20 Claims, 16 Drawing Sheets

(56) References Cited

OTHER PUBLICATIONS

Bolotnikov, A. E. et al., Material Properties Limiting the Performance of CZT Gamma-Ray Detectors, 2009.
Bube, R. H. Trap Density Determination by Space-Charge-Limited Currents. J. Appl. Phys. 1962, 33 (5), 1733-1737.
Chu, L., et al. (2019). Lead-free halide double perovskite materials: A new superstar toward green and stable optoelectronic applications. Nano-Micro Letters, 11(1), 1-18.
Del Sordo, S. et al, Progress in the Development of CdTe and CdZnTe Semiconductor Radiation Detectors for Astrophysical and Medical Applications. Sensors 2009, 9 (5), 3491-3526.
Dong, L., et al. (2018). Elastic properties and thermal expansion of lead-free halide double perovskite Cs2AgBiBr6. Computational Materials Science, 141, 49-58.
Dong, Q. et al., Electron-Hole Diffusion Lengths > 175 μm in Solution-Grown CH3NH3PbI3 Single Crystals. Science. 2015, 347 (6225), 967-970.
Feng, Y. et al., Low Defects Density CsPbBr3 Single Crystals Grown by an Additive Assisted Method for Gamma-Ray Detection . J. Mater. Chem. C 2020, 8 (33), 11360-11368.
Fritzsche, H., et al. (1974). Amorphous and liquid semiconductors. Plenum Press, New York, 1974) p. 254.
Gao, W., et al. (2018). High-Quality Cs2AgBiBr6 Double Perovskite Film for Lead-Free Inverted Planar Heterojunction Solar Cells with 2.2% Efficiency. ChemPhysChem, 19(14), 1696-1700.
Greul, E., et al. (2017). Highly stable, phase pure Cs2AgBiBr6 double perovskite thin films for optoelectronic applications. Journal of Materials Chemistry A, 5(37), 19972-19981.
Guo, L., et al. (2012). High responsivity ZnO nanowires based UV detector fabricated by the dielectrophoresis method. Sensors and Actuators B: Chemical, 166, 12-16.
Tassanien, A. S., et al. (2016). Effect of Se addition on optical and electrical properties of chalcogenide CdSSe thin films. Superlattices and Microstructures, 89, 153-169.
He, Y. et al, High Spectral Resolution of Gamma-Rays at Room Temperature by Perovskite CsPbBr3 Single Crystals. Nat. Commun. 2018, 9 (1), 1-8.
Hoye, R. L. Z. et al, Fundamental Carrier Lifetime Exceeding 1 μs in Cs2AgBiBr6 Double Perovskite. Adv. Mater. Interfaces 2018, 5 (15), 1800464.
Ji, F. et al, Lead-Free Halide Double Perovskite Cs2AgBiBr6 with Decreased Band Gap. Angew. Chemie—Int. Ed. 2020, 59 (35), 15191-15194.
Jia, L., et al. (2020). Vacuum-ultraviolet photodetectors. PhotoniX, 1(1), 1-25.
Knoll, G. F. Radiation Detection and Measurement, John Wiley, 2010.
Li, T. et al, Intrinsic Defect Properties in Halide Double Perovskites for Optoelectronic Applications. Phys. Rev. Appl. 2018, 10 (4), 041001.
Liu, Y. et al, Two-Inch-Sized Perovskite CH3NH3PbX3 (X=Cl, Br, I) Crystals: Growth and Characterization. Adv. Mater. 2015, 27 (35), 5176-5183.
Lun, Y., et al. (2021). Elastic Properties of Photovoltaic Single Crystal Cs2AgBiBr6. Experimental Mechanics, 1-7.
McClure, E. T., et al. (2016). Cs2AgBiX6 (X=Br, Cl): new visible light absorbing, lead-free halide perovskite semiconductors. Chemistry of Materials, 28(5), 1348-1354.
Momma, K. et al., "VESTA 3 for three-dimensional visualization of crystal, volumetric and morphology data," J. Appl. Crystallogr., 44, 1272-1276 (2011).
Owens, A. Compound Semiconductor Radiation Detectors; CRC Press, 2016.
Owens, A., et al. (2004). Compound semiconductor radiation detectors. Nuclear Instruments and Methods in Physics Research Section A: Accelerators, Spectrometers, Detectors and Associated Equipment, 531(1-2), 18-37.
Pan, W., et al. (2017). Cs2AgBiBr6 single-crystal X-ray detectors with a low detection limit. Nature photonics, 11(11), 726-732.
Pan, W. et al, Development of Halide Perovskite Single Crystal for Radiation Detection Applications. Front. Chem. 2020, 8, 268.
Prokesch, M. et al, CdZnTe Detectors for Gamma Spectroscopy and X-Ray Photon Counting at 250×106 Photons/(mm2s). J. Appl. Phys. 2018, 124 (4), 44503.
Rakita, Y., et al. (2015). Mechanical properties of APbX3 (A=Cs or CH3NH3; X=I or Br) perovskite single crystals. Mrs Communications, 5(4), 623-629.
Schade, L. et al, Structural and Optical Properties of Cs2AgBiBr6 Double Perovskite. ACS Energy Lett. 2019, 4 (1), 299-305.
Slavney, A. H. et al, A Bismuth-Halide Double Perovskite with Long Carrier Recombination Lifetime for Photovoltaic Applications. J. Am. Chem. Soc. 2016, 138 (7), 2138-2141.
Steele, J. A. et al., Giant Electron-Phonon Coupling and Deep Conduction Band Resonance in Metal Halide Double Perovskite. ACS Nano 2018, 12 (8), 8081-8090.
Stoumpos, C. C. et al, Crystal Growth of the Perovskite Semiconductor CsPbBr3: A New Material for High-Energy Radiation Detection. Cryst. Growth Des. 2013, 13 (7), 2722-2727.
Targhi, F. F. et al, MAPbI3 and FAPbI3 Perovskites as Solar Cells: Case Study on Structural, Electrical and Optical Properties. Results Phys. 2018, 10, 616-627.
Wang, X., et al. (2019). All-inorganic lead-free perovskites for optoelectronic applications. Materials chemistry frontiers, 3(3), 365-375.
Wei, H. et al, Dopant Compensation in Alloyed CH3NH3PbBr3-xClx Perovskite Single Crystals for Gamma-Ray Spectroscopy. Nat. Mater. 2017, 16 (8), 826-833.
Yakunin, S. et al, Detection of Gamma Photons Using Solution-Grown Single Crystals of Hybrid Lead Halide Perovskites. Nat. Photonics 2016, 10 (9), 585-589.
Yang, B. et al., Heteroepitaxial Passivation of Cs2AgBiBr6 Wafers with Suppressed Ionic Migration for X-Ray Imaging. Nat. Commun. 2019, 10 (1), 1-10.
Yang, J. et al, Stable, High-Sensitivity and Fast-Response Photodetectors Based on Lead-Free Cs2AgBiBr6 Double Perovskite Films. Adv. Opt. Mater. 2019, 7 (13), 1801732.
Zhang, H., et al. (2020). Encapsulated X-ray detector enabled by all-inorganic lead-free perovskite film with high sensitivity and low detection limit. IEEE Transactions on Electron Devices, 67(8), 3191-3198.
Zhang, M. et al, Growth and Characterization of All-Inorganic Lead Halide Perovskite Semiconductor CsPbBr3 Single Crystals. CrystEngComm 2017, 19 (45), 6797-6803.
Zhang, X., et al. (2016). Bright perovskite nanocrystal films for efficient light-emitting devices. The journal of physical chemistry letters, 7(22), 4602-4610.
Zhang, Z. et al, Optical and Electrical Properties of All-Inorganic Cs2AgBiBr6 Double Perovskite Single Crystals. RSC Adv. 2019, 9 (41), 23459-23464.
Zhang, Z., et al. (2019). Stable and highly efficient photocatalysis with lead-free double-perovskite of Cs2AgBiBr6 Angewandte Chemie International Edition, 58(22), 7263-7267.
Zhang, Z., et al. (2020). Towards radiation detection using Cs2AgBiBr6 double perovskite single crystals. Materials Letters, 269, 127667.
Zhou, L., et al. (2018). Synthesis and Photocatalytic Application of Stable Lead-Free Cs2AgBiBr6 Perovskite Nanocrystals. Small, 14(11), 1703762.
Zhang, Z. et al. (2021). Gamma-Ray Detection Using Bi-Poor Cs2AgBiBr6 Double Perovskite Single Crystals. Adv. Opt. Mater., 9(8), 2001575.

\* cited by examiner

PEROVSKITE MATERIALS FOR IONIZING RADIATION DETECTION AND RELATED METHODS

CROSS REFERENCE TO RELATED APPLICATIONS

This application claims the benefit of U.S. Provisional Application No. 63/127,261 filed on Dec. 18, 2020, which is incorporated herein by reference in its entirety.

STATEMENT REGARDING FEDERALLY SPONSORED RESEARCH OR DEVELOPMENT

This invention was made with government support under grant number NRC-HQ-60-17-G-0018 awarded by the United States Nuclear Regulatory Commission. The United States government has certain rights in the invention.

BACKGROUND

Ionizing radiation detection plays an important role in a wide range of applications including homeland security, national defense, medical imaging, sustainable energy, industrial monitoring, environmental survey, non-destructive inspection, and basic scientific research. In this regard, semiconductor-based X-ray and gamma-ray detectors are especially appealing due to their high sensitivity and excellent detection efficiency. For example, the high-purity germanium (HPGe) detectors can offer ultrahigh energy resolution (~0.3% for 662 keV gamma-ray). However, HPGe detectors need to work at cryogenic temperature, which requires complicated cooling accessories and thus affect their wide deployment in many applications. Cadmium zinc telluride (CdZnTe) is one of the leading semiconductor detector materials for room temperature X-ray and gamma-ray detection, thanks to its suitable bandgap energy of 1.57 eV and exceptional charge carrier transport properties. Nevertheless, CdZnTe often suffers from materials issues, e.g., Te inclusions/precipitates and sub-grain boundaries, which originate from the high temperature melt growth and subsequent cooling processes. Consequently, the high manufacturing cost of detector-grade CdZnTe, mainly due to low yield of as-grown ingots and need of essential post-growth thermal treatment, still limits their large-scale deployment. Another compound semiconductor material, thallium bromide (TlBr), could exhibit interesting room-temperature gamma-ray detection capabilities initially. Nevertheless, the associated polarization phenomenon, where the detection performance degrades over time, presents a realistic challenge toward the use of TlBr for gamma-ray detection. As a result, there is a strong need to search for new ionizing radiation detector materials with attractive device performance and competitive growth and fabrication cost.

In recent years, perovskite materials have emerged as new promising materials for ionizing radiation detection due to their unique advantages, such as suitable bandgap energy, high average atomic number Z, high resistivity, large mobility-lifetime product, low production cost, excellent charge carrier transport properties, and outstanding tolerance to defects. These perovskite materials can be grown using melt-based growth or solution-based growth methods. It has previously been demonstrated that the solution-grown formamidinium (FA)-based hybrid lead halide perovskites $FAPbI_3$ could achieve radiation response to gamma photons. The energy-resolving gamma spectrum of Cs-137 isotope using alloyed hybrid perovskites $CH_3NH_3PbBr_{2.94}Cl_{0.06}$ single crystals has also been reported. It should be noted that hybrid-perovskites-based devices often face the performance instability issue, which is mainly caused by ion migration and reaction with moisture and oxygen in air. This challenge must be addressed for practical applications. In theory, the all-inorganic perovskites materials are expected to possess better stability compared to their hybrid counterparts due to the absence of organic components. Asymmetrical electrode structures have been successfully employed on all-inorganic $CsPbBr_3$ single crystals, grown by Bridgman technique, to resolve gamma-rays. The rapid progress within a relatively short period clearly indicates that perovskites materials hold great potentials toward future room-temperature radiation detection. However, a major drawback for these perovskite-based radiation detector materials is the use of lead, which has serious environmental concern due to the high toxicity of lead. In this regard, it is highly desired to develop all-inorganic and environmental-friendly perovskites-based radiation detectors materials.

Despite recent advances in development of perovskite-based radiation detectors, there is still a scarcity of compounds and devices that have a low fabrication cost, acceptable device performance including a fast temporal response to irradiation, a high room temperature resistivity, and stable detection performance without degradation over time, that do not include organic components or toxic heavy metals, and that do not require cryogenic temperatures to function but can instead work under a variety of temperature conditions. These needs and other related radiation detection needs are satisfied by the present disclosure.

SUMMARY

In accordance with the purpose(s) of the present disclosure, as embodied and broadly described herein, the disclosure, in one aspect, relates to compound Bi-poor perovskite crystals, methods for making the same, and ionizing and other electromagnetic radiation detectors constructed using the Bi-poor perovskite crystals. The Bi-poor perovskite crystals can be synthesized using melt-based growth methods and solution-based growth methods and contain no toxic heavy metals such as lead, cadmium, thallium, or mercury. Devices fabricated from the crystals maintain acceptable levels of performance over time. In some aspects, post-growth annealing can be used to improve the properties, including, but not limited to, room temperature resistivity and response to radiation.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

(FIG. 1C) Photographs of Bi-normal and (FIG. 1D) Bi-poor $Cs_2AgBiBr_6$ single crystals under Nikon optical microscope.

(FIG. 2C) Rocking curve for Bragg peak (111) of Bi-poor $Cs_2AgBiBr_6$ single crystals. Also shown is the Pearson VII fitting curve.

(FIG. 3C) Photocurrent recorded for Bi-poor and Bi-normal $Cs_2AgBiBr_6$ single crystals using 450 nm laser excitation. The data is fitted by Many's equation. (FIG. 3D) Response of Bi-poor $Cs_2AgBiBr_6$-based radiation detector to 0.1 µCi Am-241 radioactive source. The detector is biased at 100 V. Also shown is the Gaussian fitting curve.

Figure 1A:
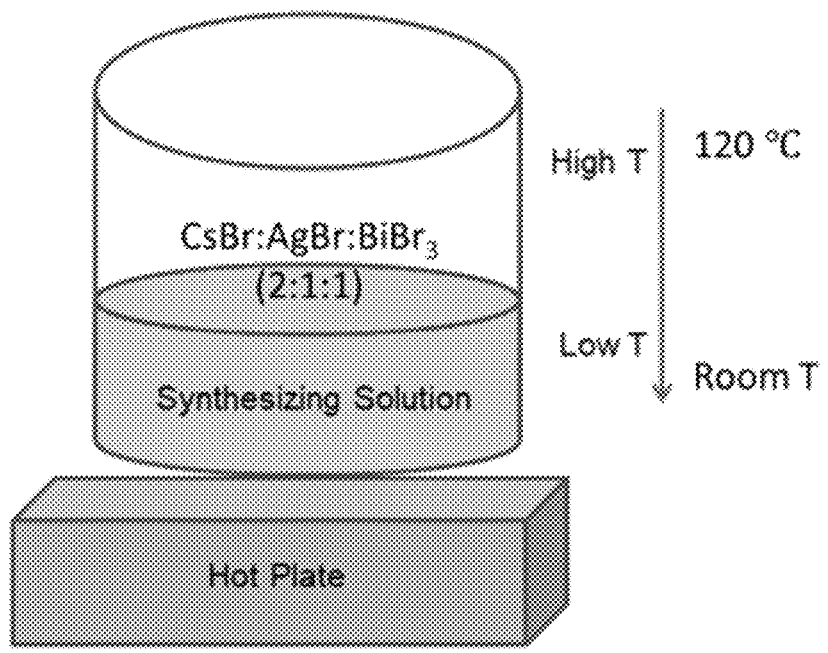
FIGS. 1A-1D show (FIG. 1A) Schematic illustration of the standard stoichiometry (such as Bi-normal) and (FIG. 1B) off-stoichiometry (such as Bi-poor) $Cs_2AgBiBr_6$ crystal growth processes.

Additional advantages of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DETAILED DESCRIPTION

Disclosed herein is the gamma energy-resolving performance of a new class of all-inorganic and lead-free $Cs_2AgBiBr_6$ double perovskite crystals. In one aspect, the high average atomic number (Cs=55, Ag=47, Bi=83, Br=35) of $Cs_2AgBiBr_6$ ensures its large stopping power for high energy gamma photons. In another aspect, $Cs_2AgBiBr_6$ possesses a long carrier lifetime which exceeds 1 µs. In a further aspect, in combination with the appropriate carrier mobility, it is capable of achieving large charge carrier mobility-lifetime product in $Cs_2AgBiBr_6$ to enable high charge collection efficiency (CCE) for gamma-ray detection. In one aspect, $Cs_2AgBiBr_6$ crystals grown from stoichiometric ratio raw materials (referred as Bi-normal growth herein) theoretically can present large number of deep level electron traps $V_{Br}$ and $Bi_{Ag}$, which are undesirable for radiation detection use. In an alternative aspect, $Cs_2AgBiBr_6$ crystals, grown from Bi-poor/Br-rich precursors, can suppress the formation of such deep electron traps. Thus, disclosed herein are $Cs_2AgBiBr_6$ crystals grown from Bi-normal and Bi-poor/Br-rich precursors respectively. In one aspect, structural and electrical property measurements of these types of $Cs_2AgBiBr_6$ crystals can be performed to analyze the performance-related factors for radiation detection. In another aspect, disclosed herein is a fabricated detector based on Bi-poor $Cs_2AgBiBr_6$ SC that showed response to 59.5 keV gamma-ray with an energy resolution of 13.91%.

Radiation detection devices incorporating the disclosed perovskite crystals can be industrially valuable including in medical imaging, nonproliferation, national security, industrial process monitoring, nuclear energy systems, nuclear materials accounting and control, astrophysics research and instrumentation, space exploration, high energy physics experiments and facilities, environmental surveys, and the like. In one aspect, current commercial compounds used for radiation detection such as, for example, CdZnTe, CdTe, CdMnTe, and TlBr are all produced using expensive melt growth techniques. In another aspect, the disclosed perovskite crystals can be produced under milder, less expensive conditions, while retaining crystal quality. In still another aspect, the disclosed double perovskite crystals do not contain toxic heavy metals such as, for example, cadmium, lead, thallium, or mercury, and are thus safer for the environment as well as human health during all stages of production and use.

Many modifications and other embodiments disclosed herein will come to mind to one skilled in the art to which the disclosed compositions and methods pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of the appended claims. The skilled artisan will recognize many variants and adaptations of the aspects described herein. These variants and adaptations are intended to be included in the teachings of this disclosure and to be encompassed by the claims herein.

Although specific terms are employed herein, they are used in a generic and descriptive sense only and not for purposes of limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

Prior to describing the various aspects of the present disclosure, the following definitions are provided and should be used unless otherwise indicated. Additional terms may be defined elsewhere in the present disclosure.

Definitions

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by", "comprising," "comprises", "comprised of," "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of." Similarly, the term "consisting essentially of" is intended to include examples encompassed by the term "consisting of.

As used in the specification and the appended claims, the singular forms "a," "an" and "the" include plural referents unless the context clearly dictates otherwise. Thus, for example, reference to "a precursor solution," "a crystal," or "a perovskite," includes, but is not limited to, mixtures or combinations of two or more such precursor solutions, crystals, or perovskites, and the like.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

As used herein, the terms "optional" or "optionally" means that the subsequently described event or circumstance can or cannot occur, and that the description includes instances where said event or circumstance occurs and instances where it does not.

As used herein, "single crystal" refers to a solid crystalline material in which the entire sample has a continuous, unbroken crystal lattice. Single crystals are free from the defects associated with grain boundaries. In one aspect, disclosed herein are single crystals useful for constructing radiation detection devices.

"Perovskite" as used herein refers to a material having a crystal structure similar to the mineral perovskite; perovskites have the general formula of $ABX_3$ where A and B are differently-sized cations and X is an anion. A "double perovskite" structure has a unit cell that is twice that of perovskite, typically with two cations ordered on the B sites. In one aspect, disclosed herein are perovskites or their derivatives (such as two-dimensional (2D) perovskites), double perovskites or their derivatives (such as two-dimensional (2D) double perovskites) useful for constructing radiation detection devices. In some aspects, the double perovskites crystals can have the formula $A_2BB'X_6$ (such as $Cs_2AgBiBr_6$), where A, B and B' are differently-sized cations and X is an anion. In one aspect, an all-inorganic perovskite or double perovskite is more stable under conditions of normal use than previously-disclosed hybrid perovskites. A "low-dimensional" perovskite can be 0D, 1D, or 2D.

A "Bi-poor" perovskite crystal, as used herein, refers to a perovskite having a chemical formula including bismuth in a less than stoichiometric amount. For example, in one aspect, a Bi-poor perovskite crystal could have a formula $Cs_2AgBi_xBr_6$, wherein x is less than 1. In one aspect, x can be less than about 1, or can be from about 0.1 to about 1, or can be from about 0.6 to about 0.8, or can be 0.1, 0.2, 0.3, 0.4, 0.5, 0.6, 0.7, 0.8, 0.9, or about 0.95, or a combination of any of the foregoing values, or a range encompassing any of the foregoing values.

"Room temperature" as used herein can be from about −40° C. to about 90° C. and represents an average temperature in a laboratory, industrial, environmental, transportation, medical, and/or home setting. In one aspect, detectors constructed using the perovskite or double perovskite crystals disclosed herein can operate at room temperature without the need for cryogenic equipment. In another aspect, detectors constructed using the perovskite or double perovskite crystals disclosed herein can operate above or below temperatures traditionally associated with occupant comfort, such as, for example, over the range of about −40° C. to about 90° C. In one aspect, room temperature is from about 18° C. to about 25° C.

"Annealing" as used herein refers to the process of heating a crystal from about room temperature to an elevated temperature over a period of time. In one aspect, the elevated temperature or annealing temperature can be about 80° C. In another aspect, a period of time useful for annealing can be about 3 hours.

"Crystal resistivity" refers to the resistivity (ρ) per unit volume of a material; in this case, of the double perovskite crystals disclosed herein. Units are typically given in Ω·m, or, herein, in Ω·cm. A crystal with a low resistivity acts as a conductor, while a high resistivity crystal would be an insulator. In one aspect, the perovskite or double perovskite crystals disclosed herein have crystal resistivity values of from about $1.0 \times 10^5$ Ω·cm to about $1.0 \times 10^{14}$ Ω·cm. Exemplary methods for determining crystal resistivity are provided in the examples.

"Traps" as used herein are local electron energy states at defects in the crystals. In one aspect, traps in insulators bind electrons tightly, while traps in semiconductors bind electrons more weakly. Meanwhile, "density of trap states" refers to the relative number of trap states in a given volume of perovskite crystals. In one aspect, the perovskite crystals disclosed herein have trap state densities at least several orders of magnitude lower than polycrystalline perovskite thin films of similar atomic composition. Exemplary methods for determining density of trap states are provided in the Examples.

As used herein, "charge carrier mobility" refers to mobility of charge carriers (e.g., electrons and/or holes) in a metal or semiconductor or insulator in the presence of an electric field and is defined as drift velocity per unit of electric field, typically expressed in $cm^2/V \cdot s$. Exemplary methods for determining charge carrier mobility are provided in the Examples.

"Mobility lifetime product" (μ-τ) as used herein is a factor that ultimately determines the drift distance of charge carriers. In one aspect, a suitable semiconductor such as, for example, the perovskite crystals disclosed herein has a large mobility lifetime product. Exemplary methods for determining mobility lifetime product are provided in the Examples.

"Young's modulus" is a measurement or expression of the stiffness of a material, or, in essence, how easily the material can be deformed, such as being bent or stretched. In one aspect, Young's modulus can be expressed as the slope of a plot of stress versus strain of the material.

"Hardness" or "indentation hardness" as used herein is the resistance of a material to deformation. In one aspect, hardness or indentation hardness can be measured by pressing an object into a material until an impression or indentation is formed. In another aspect, the object used to determine hardness can be a Berkovich tip.

An "X-ray" as used herein refers to a form of high-energy electromagnetic radiation, usually emitted by electron transitions between electron shells (i.e., characteristic X-rays) and typically having a wavelength from about 10 μm to about 10 nm and an energy from about 124 eV to about 124 keV. In some aspects, X-rays can cause physiological damage to humans and/or animals including hair loss, burns, and even death with repeated exposure. Thus, detection of radiation from X-rays in various medical and industrial settings is of great importance. In one aspect, disclosed herein are perovskite or double perovskite crystals useful for detecting X-rays and radiation-detection devices incorporating the same.

"Gamma-ray" as used herein refers to a type of electromagnetic radiation that arises when atomic nuclei radioactively decay; gamma-rays have the shortest wavelengths (less than about 100 µm) and highest energies (on the order of 100 keV to greater than 10 MeV), having some degree of overlap with X-rays. Depending upon exposure, gamma rays can pose significant health risks, including, but not limited to, acute tissue damage, DNA damage, and death. Thus, detection of gamma radiation is also of great importance. In one aspect, disclosed herein are perovskite or double perovskite crystals useful for detecting gamma-rays and radiation-detection devices incorporating the same.

"Alpha radiation" as used herein (also sometimes referred to as "alpha ray" or "alpha particle") refers to two protons and two neutrons bound together into a particle equivalent to a helium-4 nucleus. Alpha radiation can be produced by alpha decay or by other methods. In some aspects, alpha radiation can be emitted from naturally occurring materials including uranium, thorium, radium, polonium-210, or man-made elements including plutonium or americium.

"Beta radiation" as used herein (also sometimes referred to as "beta ray" or "beta particle") refers to an electron or positron emitted by the radioactive decay of an atomic nucleus such as, for example, strontium-90, tritium, and/or carbon-14, during beta decay.

Unless otherwise specified, temperatures referred to herein are based on atmospheric pressure (i.e. one atmosphere).

Methods for Making Perovskite Crystals

In one aspect, disclosed herein is a method for making one or more perovskite or double perovskite crystals, the method including at least the steps of:
  (a) dissolving a first salt and a second salt in an acid to form a first solution;
  (b) adding a third salt to the first solution to form a second solution;
  (c) stirring the second solution at a first temperature;
  (d) decreasing the temperature of the second solution from the first temperature to a third temperature to form the crystals and a supernatant solution; and
  (e) pouring out the supernatant solution and harvesting the perovskite crystals.

In another aspect, the first salt can be or include cesium bromide, cesium chloride, or a combination thereof. In another aspect, the second salt can be or include bismuth bromide, bismuth chloride, or a combination thereof. In one aspect, the acid can be hydrobromic acid, hydrochloric acid, or a combination thereof. In still another aspect, the third salt can be silver bromide, silver chloride, or a combination thereof. In one aspect, the first salt is cesium bromide, the second salt is bismuth bromide, the acid is hydrobromic acid, and the third salt is silver bromide.

In one aspect, the first temperature can be from about 0° C. to about 500° C., or can be about 0, 25, 50, 75, 100, 125, 150, 175, 200, 225, 250, 275, 300, 325, 350, 375, 400, 425, 450, 475, or about 500° C., or a combination of any of the foregoing values, or a range encompassing any of the foregoing values. In one aspect, the first temperature is from about 110° C. to about 140° C. In another aspect, decreasing the temperature in step (d) of the method can include decreasing the temperature at a rate of from about 0.001° C. to about 200° C. per hour until the third temperature is reached. In another aspect, the rate can be about 0.001, 0.01, 0.1, 1, 5, 10, 25, 50, 75, 100, 125, 150, 175, or about 200° C., or a combination of any of the foregoing values, or a range encompassing any of the foregoing values.

In another aspect, provided herein is a method for making one or more perovskite crystals, the method including the steps of:
  (a) admixing a first salt, a second salt, and a third salt to form a first admixture;
  (b) bringing the first admixture to a first temperature at which at least one of the first salt, second salt, or third salt is molten;
  (c) optionally holding the first admixture at the first temperature until the first admixture is homogeneous;
  (d) decreasing the temperature of the first admixture to a second temperature at which perovskite crystals form; and
  (e) optionally cooling the perovskite crystals to a third temperature.

In another aspect, the first salt can be or include cesium bromide, cesium chloride, or a combination thereof. In another aspect, the second salt can be or include bismuth bromide, bismuth chloride, or a combination thereof. In still another aspect, the third salt can be silver bromide, silver chloride, or a combination thereof. In one aspect, the first salt is cesium bromide, the second salt is bismuth bromide, and the third salt is silver bromide.

In any of these aspects, the method can further include rinsing the crystals with ethanol, isopropanol, acetone, or any combination thereof.

In one aspect, the first salt and the second salt are present in the first solution in a stoichiometric ratio of about 2.0:1.0, or in an off-stoichiometric ratio of from about 2.0:0.8 to about 2.0:0.6. In another aspect, when used, the acid is present in a molar excess amount relative to the first salt and the second salt. In still another aspect, the first salt and the third salt are present in the second solution in a stoichiometric ratio of about 2.0:1.0.

In any of these aspects, the third temperature can be from about 15° C. to about 30° C.

Perovskite Crystals and Properties Thereof

Also disclosed herein are perovskite crystals produced by the disclosed methods. In one aspect, the crystals are Bi-poor perovskite crystals having the formula $Cs_2AgBi_xBr_6$, wherein x is less than 1, or wherein x is from about 0.1 to about 1, or from about 0.6 to about 0.8, or is about 0.1, 0.2, 0.3, 0.4, 0.5, 0.6, 0.7, 0.8, 0.9, or about 0.95, or a combination of any of the foregoing values, or a range encompassing any of the foregoing values. In one aspect, the perovskite crystals have a double perovskite crystal structure or a derivative of a single perovskite structure or double perovskite structure such as, for example, a two-dimensional perovskite or two-dimensional double perovskite. In some aspects, the Bi-poor perovskite crystals can have a three-dimensional perovskite structure, a low-dimensional (i.e., 0D, 1D, or 2D) perovskite structure, or any combination thereof. In another aspect, the perovskite crystals are substantially free of toxic materials such as lead, cadmium, thallium, and mercury. In another aspect, the perovskite crystals can be single crystals.

In one aspect, the perovskite crystal has a crystal resistivity of from about $1.0 \times 10^5$ Ω·cm to about $1.0 \times 10^{14}$ Ω·cm, $1.0 \times 10^5$, $1.0 \times 10^6$, $1.0 \times 10^7$, $1.0 \times 10^8$, $1.0 \times 10^9$, $1.0 \times 10^{10}$, $1.0 \times 10^{11}$, $1.0 \times 10^{12}$, $1.0 \times 10^{13}$, $1.0 \times 10^{14}$, or of about or a combination of any of the foregoing values, or a range encompassing any of the foregoing values. In another aspect, the crystal resistivity is about $1.62 \times 10^{11}$ Ω·cm or about $1.56 \times 10^{11}$ Ω·cm.

In another aspect, the perovskite crystal has a density of trap states of from about $4 \times 10^{10}$ cm$^{-3}$ to about $2 \times 10^9$ cm$^{-3}$, or of about 4, 4.5, 5, 5.5, 6, 6.5, 7, 7.5, 8, 8.5, or $9 \times 10^{10}$ cm$^{-3}$ or about 1, 1.5, or $2\times10^9$ cm$^{-3}$, or a combination of any of the foregoing values, or a range encompassing any of the foregoing values. In one aspect, the density of trap states is about $3.85\times10^{10}$ cm$^{-3}$ or is about $2.65\times10^9$ cm$^{-3}$.

In still another aspect, the perovskite crystal has a charge carrier mobility of from about 1 cm$^2$/V-s to about 4 cm$^2$/V-s, or of about 1, 1.5, 2, 2.5, 3, 3.5, or about 4 cm$^2$/V-s, or a combination of any of the foregoing values, or a range encompassing any of the foregoing values. In one aspect, the charge carrier mobility can be about 1.35 cm$^2$/V-s or can be about 3.59 cm$^2$/V-s.

In another aspect, the perovskite crystal can have a mobility lifetime product of from about $1.0\times10^{-1}$ cm$^2$/V to about $1.0\times10^{-7}$ cm$^2$/V, or of about $1.0\times10^{-1}$, $1.0\times10^{-2}$, $1.0\times10^{-3}$, $1.0\times10^{-4}$, $1.0\times10^{-5}$, $1.0\times10^{-6}$, or of about $1.0\times10^{-7}$ cm$^2$/V, or a combination of any of the foregoing values, or a range encompassing any of the foregoing values. In one aspect, the mobility lifetime product can be about $5.19\times10^{-4}$ cm$^2$/V or can be about $1.47\times10^{-3}$ cm$^2$/V.

In any of these aspects, the Bi-poor perovskite crystal can be annealed by holding the Bi-poor perovskite crystal at an annealing temperature of between about 25° C. to about 450° C., or at about 250, 50, 75, 100, 125, 150, 175, 200, 225, 250, 275, 300, 325, 350, 375, 400, 425, or about 450° C., or a combination of any of the foregoing values, or a range encompassing any of the foregoing values. In another aspect, the Bi-poor perovskite crystal can be held at the annealing temperature for a period of from about 1 minute to about 90 days, or for about 1, 2, 5, 10, 15, 30, or about 45 minutes, or for about 1, 2, 3, 4, 5, 6, 7, 8, 9, 10, 11, or about 12 hours, or for about 1, 5, 10, 15, 20, 25, 30, 35, 40, 45, 50, 55, 60, 65, 70, 75, 80, 85, or about 90 days, or a combination of any of the foregoing values, or a range encompassing any of the foregoing values.

Exemplary methods for measuring and calculating the disclosed properties are provided in the Examples.

Method for Making an Ionizing Radiation Detector

In one aspect, disclosed herein is a method for making a perovskite crystal ionizing radiation detector, the method comprising:
  (a) providing a perovskite crystal; and
  (b) depositing one or more electrodes onto the crystal.

In another aspect, the perovskite crystal can have a first side and a second side, and the at least one electrode can be deposited on the first side, the second side, or any combination thereof. In another aspect, the at least one electrode can include a first electrode and a second electrode, and the first electrode can be deposited on the first side of the perovskite crystal while the second electrode can be deposited on the second side of the perovskite crystal. In one aspect, the electrodes can have different configurations including but not limited to planar detectors, pixelated detectors, co-planar detectors, quasi-hemispherical detectors, virtual Frisch-grid detectors, or any combination thereof. In one aspect, the perovskite crystal can have a thickness of from about 0.001 mm to about 1000 mm separating the first side from the second side, or of about 0.001, 0.01, 0.1, 1, 1.25, 1.5, 1.75, 2, 5, 10, 50, 100, 150, 200, 250, 300, 350, 400, 450, 500, 550, 600, 650, 700, 750, 800, 850, 900, 950, or about 1000 mm, or a combination of any of the foregoing values, or a range encompassing any of the foregoing values.

In another aspect, the electrodes can be made from gold, platinum, silver, gallium, indium, bismuth, nickel, carbon (including, but not limited to, carbon-60) or any combination thereof. In one aspect, depositing the electrodes onto the perovskite crystal includes brushing the crystal with silver paste or carbon paste, a physical deposition method, or a chemical deposition method.

In another aspect, provided herein is a perovskite crystal ionizing radiation detector produced by the disclosed methods. In one aspect, the detector is responsive to photons having energies in the range of from about 10 eV to about 10 MeV, or of about 100, 200, 300, 400, 500, 600, 700, 800, or about 900 eV, about 1, 5, 10, 50, 100, or 500 keV, or of about 1, 2, 3, 4, 5, 6, 7, 8, 9, or about 10 MeV, or a combination of any of the foregoing values, or a range encompassing any of the foregoing values.

In one aspect, when the perovskite crystal used in the ionizing radiation detector is synthesized in Bi-poor conditions, it can be useful in detecting gamma-ray radiation. In another aspect, when the perovskite crystal used in the ionizing radiation detector is synthesized in Bi-normal conditions, it can be useful in detecting X-ray radiation.

Radiation Detectors Including Perovskite Crystals

In another aspect, disclosed herein is a radiation detector including:
  (a) a disclosed perovskite crystal; and
  (b) one or more electrodes in contact with the perovskite crystal.

In an aspect, the crystal can include a first side and a second side and the one or more electrodes can be in contact with the first side, the second side, or both. In another aspect, the one or more electrodes can be made from gold, platinum, silver, gallium, indium, bismuth, nickel, carbon, or any combination thereof. In still another aspect, the one or more electrodes can include a bias electrode and a measurement electrode.

Methods for Detecting Radiation

In one aspect, provided herein is a method for detecting radiation, the method including at least the following steps:
  (a) placing a detector as disclosed herein in contact with a measurement system, wherein the measurement system comprises a preamplifier, an amplifier, a multi-channel analyzer, and a computer;
  (b) exposing the detector to radiation and applying bias voltage; and
  (c) recording the radiation energy spectrum;
  wherein, in the presence of radiation, the energy spectrum displays at least one peak that is absent in the absence of radiation.

In another aspect, disclosed herein is a method for detecting radiation, the method including at least the following steps:
  (a) contacting a detector as disclosed herein with electrodes deposited on a first side of the detector and on a second side of the detector;
  (b) placing a bias electrode in contact with the electrodes on the first side of the detector and supplying a bias voltage to the bias electrode;
  (c) placing one or more measurement electrodes in contact with the electrodes on the second side of the detector;
  (d) exposing the detector to radiation, wherein the radiation produces electron-hole pairs, induces an electronic signal in the detector, or both; and
  (e) recording the electronic signal;
  wherein the electronic signal displays a linear or non-linear response with respect to the bias voltage.

In still another aspect, disclosed herein is a method for detecting radiation, the method including at least the following steps:

(a) exposing a disclosed radiation detector to radiation and applying a bias voltage to the bias electrode, wherein the radiation induces an electronic signal in the detector; and (b) measuring the electronic signal;

wherein, when radiation is present, the electronic signal includes at least one feature that is absent when radiation is absent.

In one aspect, the electronic signal can be current.

In another aspect, the bias voltage is from about −10,000 V to about 10,000 V, or is about −10,000, −9,000, −8,000, −7,000, −6,000, −5,000, −4,000, −3,000, −2,000, −1,000, 1,000, 2,000, 3,000, 4,000, 5,000, 6,000, 7,000, 8,000, 9,000, or about 10,000 V, or a combination of any of the foregoing values, or a range encompassing any of the foregoing values.

In one aspect, the radiation can be ionizing radiation, such as, for example, gamma-ray radiation, X-ray radiation, alpha particle radiation, beta particle radiation, ultraviolet radiation, or a combination thereof. In another aspect, the at least one peak in the energy spectrum is located at about 59.5 keV. In another aspect, the detector displays an enhanced current in the presence of 59.5 keV gamma-rays, 80 keV gamma rays, 88 keV gamma rays, 122 keV gamma rays, 356 keV gamma rays, 511 keV gamma-rays, 662 keV gamma-rays, or a combination thereof.

In still another aspect, the ionizing radiation can be emitted from an Am-241 radioactive source, a Na-22 radioactive source, a Cs-137 radioactive source, a Co-57 radioactive source, a Ba-133 radioactive source, a Cd-109 radioactive source, or any combination thereof.

In another aspect, the ionizing radiation can be X-ray radiation and can have energy of about 10 eV to 100 keV, or of about 10, 100, or 500 eV, or of about 1, 5, 10, 25, 50, 75, or of about 100 keV, or a combination of any of the foregoing values, or a range encompassing any of the foregoing values.

In still another aspect, the ionizing radiation can be gamma-ray radiation and can have energy of about 100 keV to 10 MeV, or of about 100, 250, 500, or about 750 keV, or of about 1, 2, 3, 4, 5, 6, 7, 8, 9, or about 10 MeV, or a combination of any of the foregoing values, or a range encompassing any of the foregoing values.

In still another aspect, the ionizing radiation can be alpha radiation, beta radiation, or ultraviolet radiation.

In another aspect, the radiation can be extended UV, visible, or near infra-red (NIR) radiation having a wavelength of from about 310 nm to about 1600 nm, or of about 310, 320, 340, 460, 380, 400, 420, 440, 460, 480, 500, 520, 540, 560, 580, 600, 620, 640, 660, 680, 700, 720, 740, 760, 780, 800, 820, 840, 860, 880, 900, 920, 940, 960, 980, 1000, 1020, 1040, 1060, 1080, 1100, 1120, 1140, 1160, 1180, 1200, 1220, 1240, 1260, 1280, 1300, 1320, 1340, 1360, 1380, 1400, 1420, 1440, 1460, 1480, 1500, 1520, 1540, 1560, 1580, or about 1600 nm, or a combination of any of the foregoing values, or a range encompassing any of the foregoing values.

In any of these aspects, the detector can be a planar detector, a pixelated detector, a co-planar detector, a quasi-hemispherical detector, a virtual Frisch-grid detector, another radiation detector, or any combination thereof.

In one aspect, the crystal in the detector can be a Bi-poor perovskite crystal that has been annealed. In another aspect, the crystal in the detector may not have been annealed. In any of these aspects, the current from a detector containing an annealed perovskite crystal can have an intensity of from about 2× to about 20×, or from about 3× to about 4×, or about 2, 3, 4, 5, 6, 7, 8, 9, 10, 11, 12, 13, 14, 15, 16, 17, 18, 19, or about 20× the intensity of the current from a detector containing an identical perovskite crystal that has not been annealed, when the same bias voltage is applied, or a combination of any of the foregoing values, or a range encompassing any of the foregoing values.

Now having described the aspects of the present disclosure, in general, the following examples describe some additional aspects of the present disclosure. While aspects of the present disclosure are described in connection with the following examples and the corresponding text and figures, there is no intent to limit aspects of the present disclosure to this description. On the contrary, the intent is to cover all alternatives, modifications, and equivalents included within the spirit and scope of the present disclosure.

Aspects

The present disclosure can be described in accordance with the following numbered aspects, which should not be confused with the claims.

Aspect 1. A method for making one or more perovskite crystals, the method comprising:
(a) dissolving a first salt and a second salt in an acid to form a first solution;
(b) adding a third salt to the first solution to form a second solution;
(c) stirring the second solution at a first temperature;
(d) decreasing the temperature of the second solution from the first temperature to a third temperature to form the crystals and a supernatant solution; and
(e) pouring out the supernatant solution and harvesting the perovskite crystals.

Aspect 2. The method of aspect 1, wherein the first salt comprises cesium bromide or cesium chloride.

Aspect 3. The method of aspect 1 or 2, wherein the second salt comprises bismuth bromide or bismuth chloride.

Aspect 4. The method of any one of aspects 1-3, wherein the acid comprises hydrobromic acid or hydrochloric acid.

Aspect 5. The method of any one of aspects 1-4, wherein the third salt comprises silver bromide or silver chloride.

Aspect 6. The method of any one of aspects 1-5, wherein the first salt is cesium bromide, the second salt is bismuth bromide, the acid is hydrobromic acid, and the third salt is silver bromide.

Aspect 7. The method of any one of aspects 1-6, wherein the first temperature is from about 0° C. to about 500° C.

Aspect 8. The method of any one of aspects 1-6, wherein the first temperature is from about 110° C. to about 140° C.

Aspect 8. The method of any one of aspects 1-7, wherein decreasing the temperature comprises decreasing from the first temperature by a rate of from about 0.001° C. per hour to about 200° C. per hour until the third temperature is reached.

Aspect 9. A method for making one or more perovskite crystals, the method comprising:
(a) admixing a first salt, a second salt, and a third salt to form a first admixture;
(b) bringing the first admixture to a first temperature at which at least one of the first salt, second salt, or third salt is molten;
(c) optionally holding the first admixture at the first temperature until the first admixture is homogeneous;
(d) decreasing the temperature of the first admixture to a second temperature at which perovskite crystals form; and (e) optionally cooling the perovskite crystals to a third temperature.

Aspect 10. The method of aspect 9, wherein the first salt comprises cesium bromide or cesium chloride.

Aspect 11. The method of aspect 9 or 10, wherein the second salt comprises bismuth bromide or bismuth chloride.

Aspect 12. The method of any one of aspects 9-11, wherein the third salt comprises silver bromide or silver chloride.

Aspect 13. The method of any one of aspects 9-12, wherein the first salt is cesium bromide, the second salt is bismuth bromide, and the third salt is silver bromide.

Aspect 14. The method of any one of aspects 1-13, further comprising rinsing the crystals with ethanol, isopropanol, acetone, or any combination thereof.

Aspect 15. The method of any one of aspects 1-14, wherein the third temperature is from about 15° C. to about 30° C.

Aspect 16. The method of any one of aspects 1-15, wherein, in step (a), the first salt and the second salt are present in the first solution in a stoichiometric ratio of about 2.0:1.0.

Aspect 17. The method of any one of aspects 1-15, wherein, in step (a), the first salt and the second salt are present in the first solution in an off-stoichiometric ratio of from about 2.0:0.8 to about 2.0:0.6.

Aspect 18. The method of any one of aspects 1-8, wherein the acid is present in a molar excess amount relative to the first salt and the second salt.

Aspect 19. The method of any one of aspects 1-18, wherein the first salt and the third salt are present in the second solution in a stoichiometric ratio of about 2.0:1.0.

Aspect 20. The method of any one of the preceding aspects, further comprising annealing the perovskite crystals after step (e), wherein annealing comprises raising a temperature of the perovskite crystals from about room temperature to an annealing temperature.

Aspect 21. The method of aspect 20, wherein the annealing temperature is from about 25° C. to about 450° C.

Aspect 22. The method of aspect 20 or 21, wherein the annealing temperature is about 80° C.

Aspect 23. The method of any one of aspects 20-22, wherein the perovskite crystals are annealed for a period of from about 1 minute to about 90 days.

Aspect 24. The method of any one of aspects 20-23, wherein raising the temperature of the perovskite crystals is conducted over a period of about 3 hours.

Aspect 25. A perovskite crystal produced by the method of any one of aspects 1-24.

Aspect 26. The perovskite crystal of aspect 25, wherein the perovskite crystal is a Bi-poor perovskite crystal having the formula $Cs_2AgBi_xBr_6$, wherein x is less than 1.

Aspect 27. The perovskite crystal of aspect 25 or 26, wherein the perovskite crystal comprises a single perovskite structure, a double perovskite structure, or a derivative of a single perovskite structure or double perovskite structure.

Aspect 28. The perovskite crystal of aspect 27, wherein the derivative comprises a two-dimensional perovskite or a two-dimensional double perovskite.

Aspect 29. The perovskite crystal of aspect 27, wherein the perovskite crystal comprises a three-dimensional perovskite structure, a low-dimensional perovskite structure, or any combination thereof.

Aspect 30. The perovskite crystal of any one of aspects 25-29, wherein the perovskite crystal is substantially free of lead, cadmium, thallium, and mercury.

Aspect 31. The perovskite crystal of any one of aspects 25-30, wherein the perovskite crystal comprises a crystal resistivity of from about $1.0\times10^5$ Ω·cm to about $1.0\times10^{14}$ Ω·cm.

Aspect 32. The perovskite crystal of any one of aspects 25-30, wherein the perovskite crystal comprises a crystal resistivity of from about $8.07\times10^9$ Ω·cm to about $2.13\times10^{10}$ Ω·cm.

Aspect 33. The perovskite crystal of any one of aspects 25-30, wherein the perovskite crystal comprises a crystal resistivity of about $1.62\times10^{11}$ Ω·cm.

Aspect 34. The perovskite crystal of any one of aspects 25-30, wherein the perovskite crystal comprises a crystal resistivity of about $1.56\times10^{11}$ Ω·cm.

Aspect 35. The perovskite crystal of any one of aspects 31-34, wherein the crystal resistivity is temperature dependent.

Aspect 36. The perovskite crystal of aspect 35, wherein the crystal resistivity is about $8.07\times10^9$ Ω·cm at about room temperature.

Aspect 37. The perovskite crystal of aspect 35, wherein the crystal resistivity is about $4.07\times10^9$ Ω·cm at about 40° C.

Aspect 38. The perovskite crystal of aspect 35, wherein the crystal resistivity is about $3.58\times10^8$ Ω·cm at about 60° C.

Aspect 39. The perovskite crystal of aspect 35, wherein the crystal resistivity is about $5.86\times10^7$ Ω·cm at about 80° C.

Aspect 40. The perovskite crystal of any one of aspects 25-39, wherein the perovskite crystal comprises a density of trap states of from about $4\times10^{10}$ cm$^{-3}$ to about $2\times10^9$ cm$^{-3}$.

Aspect 41. The perovskite crystal of any one of aspects 25-39, wherein the perovskite crystal comprises a density of trap states of about $3.85\times10^{10}$ cm$^{-3}$.

Aspect 42. The perovskite crystal of any one of aspects 25-39, wherein the perovskite crystal comprises a density of trap states of about $2.65\times10^9$ cm$^{-3}$.

Aspect 43. The perovskite crystal of any one of aspects 25-42, wherein the perovskite crystal comprises a charge carrier mobility of from about 1 cm$^2$/V-s to about 4 cm$^2$/V-s.

Aspect 44. The perovskite crystal of any one of aspects 25-42, wherein the perovskite crystal comprises a charge carrier mobility of about 1.35 cm$^2$/V-s.

Aspect 45. The perovskite crystal of any one of aspects 25-42, wherein the perovskite crystal comprises a charge carrier mobility of 3.59 cm$^2$/V-s.

Aspect 46. The perovskite crystal of any one of aspects 25-45, wherein the perovskite crystal comprises a mobility lifetime product of from about $1.0\times10^{-1}$ cm$^2$/V to $1.0\times10^{-7}$ cm$^2$/V.

Aspect 47. The perovskite crystal of any one of aspects 25-45, wherein the perovskite crystal comprises a mobility lifetime product of about 5.19×10–4 cm$^2$/V.

Aspect 48. The perovskite crystal of any one of aspects 25-45, wherein the perovskite crystal comprises a mobility lifetime product of about 1.47×10–3 cm$^2$/V.

Aspect 49. The perovskite crystal of any one of aspects 25-48, wherein the perovskite crystal has a Young's modulus of from about 20 to about 45 GPa.

Aspect 50. The perovskite crystal of any one of aspects 25-48, wherein the perovskite crystal has a Young's modulus of from about 30 to about 35 GPa.

Aspect 51. The perovskite crystal of any one of aspects 25-50, wherein the perovskite crystal has a hardness as measured by indentation with a Berkovich tip of from about 0.5 GPa to about 1.5 GPa.

Aspect 52. The perovskite crystal of any one of aspects 25-50, wherein the perovskite crystal has a hardness as measured by indentation with a Berkovich tip of from about 0.9 GPa to about 1.2 GPa.

Aspect 53. A method for making a perovskite crystal ionizing radiation detector, the method comprising:
(a) providing a perovskite crystal according to any of aspects 25-52; and
(b) depositing one or more electrodes onto the crystal.

Aspect 54. The method of aspect 53, wherein the perovskite crystal comprises a first side and a second side, and the at least one electrode is deposited on the first side, the second side, or any combination thereof.

Aspect 55. The method of aspect 54, wherein the one or more electrodes comprises at least two electrodes including a first electrode and a second electrode, and the first electrode is deposited on the first side of the perovskite crystal and the second electrode is deposited on the second side of the perovskite crystal.

Aspect 56. The method of aspect 54 or 55, wherein the perovskite crystal has a thickness of from about 0.001 mm to about 1000 mm separating the first side from the second side.

Aspect 57. The method of aspect 54 or 55, wherein the perovskite crystal has a thickness of about 1.5 mm separating the first side from the second side.

Aspect 58. The method of any one of aspects 53-57, wherein the electrodes comprise gold, platinum, silver, gallium, indium, bismuth, nickel, carbon, or any combination thereof.

Aspect 59. The method of any one of aspects 53-58, wherein depositing the electrodes onto the crystal comprises brushing the crystal with silver paste or carbon paste, a physical deposition method, or a chemical deposition method.

Aspect 60. A perovskite crystal based ionizing radiation detector produced by the method of any one of aspects 53-59.

Aspect 61. The perovskite crystal based ionizing radiation detector of aspect 60, wherein the detector is responsive to photons having energy in the range of from about 10 eV to about 10 MeV.

Aspect 62. A method for detecting radiation comprising:
(a) placing a detector according to aspect 60 or 61 in contact with a measurement system, wherein the measurement system comprises a preamplifier, an amplifier, a multichannel analyzer, and a computer;
(b) exposing the detector to radiation and applying bias voltage; and
(c) recording the radiation energy spectrum;
wherein, in the presence of radiation, the energy spectrum displays at least one response that is absent in the absence of radiation.

Aspect 63. The method of aspect 62, wherein the radiation comprises ionizing radiation.

Aspect 64. The method of aspect 63, wherein the ionizing radiation comprises gamma-ray radiation, X-ray radiation, alpha radiation, beta radiation, ultraviolet radiation, or a combination thereof.

Aspect 65. The method of aspect 63, wherein the bias voltage is from about −10,000 V to about 10,000 V.

Aspect 66. The method of aspect 63, wherein the at least one response comprises a peak in the energy spectrum located at about 59.5 keV Aspect 67. The method of aspect 63, wherein the detector displays an enhanced current in the presence of 59.5 keV gamma-rays, 80 keV gamma rays, 88 keV gamma rays, 122 keV gamma rays, 356 keV gamma rays, 511 keV gamma-rays, 662 keV gamma-rays, or a combination thereof.

Aspect 68. The method of any one of aspects 63-67, wherein the ionizing radiation is emitted from an Am-241 radioactive source, a Na-22 radioactive source, a Cs-137 radioactive source, a Co-57 radioactive source, a Ba-133 radioactive source, a Cd-$10^9$ radioactive source, or any combination thereof.

Aspect 69. The method of aspect 62, wherein the radiation comprises extended UV, visible, or near infra-red (NIR) radiation.

Aspect 70. The method of aspect 69, wherein the radiation has a wavelength of from about 310 nm to about 1600 nm.

Aspect 71. The method of aspect 69, wherein the visible radiation has a wavelength of from about 500 nm to about 600 nm.

Aspect 72. The method of aspect 69, wherein the visible radiation has a wavelength of 568 nm.

Aspect 73. The method of any one of aspects 69-72, wherein the at least one response comprises a photocurrent.

Aspect 74. The method of aspect 73, wherein the photocurrent has a rising time of from about 0.4 to about 2.4 s.

Aspect 75. The method of aspect 73, wherein the photocurrent has a rising time of about 0.53 s.

Aspect 76. The method of any one of aspects 73-75, wherein the photocurrent has a falling time of from about 1.5 to about 2.5 s.

Aspect 77. The method of any one of aspects 73-75, wherein the photocurrent has a falling time of about 1.57 s.

Aspect 78. The method of any one of aspects 69-73, wherein the photocurrent from a detector containing an annealed perovskite crystal has an intensity of from about 2× to about 20× the intensity of the photocurrent from a detector containing an identical perovskite crystal that has not been annealed when the same bias voltage is applied.

Aspect 79. The method of any one of aspects 69-73, wherein the photocurrent from a detector containing an annealed perovskite crystal has an intensity of about 3× the intensity of the photocurrent from a detector containing an identical perovskite crystal that has not been annealed when the same bias voltage is applied.

Aspect 80. A method for detecting radiation comprising:
(a) contacting a detector according to aspect 60 or 61 with electrodes on a first side of the detector and on a second side of the detector;
(b) placing a bias electrode on the first side of the detector and supplying a bias voltage to the bias electrode;
(c) placing one or more measurement electrodes in contact with the electrodes on the second side of the detector;
(d) exposing the detector to radiation, wherein the radiation produces electron-hole pairs, induces an electronic signal in the detector, or both; and
(e) recording the electronic signal;
wherein the electronic signal displays a linear or non-linear response with respect to the bias voltage.

Aspect 81. The method of aspect 80, wherein the electronic signal comprises current, a change of measured current, or both.

Aspect 82. The method of aspect 80, wherein the bias voltage is from about −10,000 V to about 10,000 V.

Aspect 83. The method of any one of aspects 80-82, wherein the perovskite crystal in the detector is an annealed perovskite crystal.

Aspect 84. The method of any one of aspects 80-83, wherein the radiation is ionizing radiation.

Aspect 85. The method of aspect 84, wherein the ionizing radiation is X-ray radiation and has energy of about 10 eV to 100 keV.

Aspect 86. The method of aspect 84, wherein the ionizing radiation is gamma-ray radiation and has energy of about 100 keV to 10 MeV.

Aspect 87. The method of aspect 84, wherein the ionizing radiation is alpha radiation, beta radiation or ultraviolet radiation, or any combination thereof.

Aspect 88. The method of any one of aspects 80-83, wherein the radiation is extended UV, visible, or near infra-red (NIR) radiation.

Aspect 89. The method of aspect 88, wherein the radiation has a wavelength of from about 310 nm to about 1600 nm.

Aspect 90. The method of aspect 88, wherein the visible radiation has a wavelength of from about 380 nm to about 740 nm.

Aspect 91. The method of aspect 88, wherein the visible radiation has a wavelength of from about 500 nm to about 600 nm.

Aspect 92. The method of aspect 88, wherein the visible radiation has a wavelength of 568 nm.

Aspect 93. The method of any one of aspects 88-92, wherein the current from a detector containing an annealed perovskite crystal has an intensity of from about 2× to about 20× an intensity of a detector containing an identical perovskite crystal that has not been annealed when the same bias voltage is applied.

Aspect 94. The method of any one of aspects 88-92, wherein the current from a detector containing an annealed perovskite crystal has an intensity of about 3× the intensity of a detector containing an identical perovskite crystal that has not been annealed when the same bias voltage is applied.

Aspect 95. The methods of any of aspects 80-94 wherein the detector comprises a planar detector, a pixelated detector, a co-planar detector, a quasi-hemispherical detector, a virtual Frisch-grid detector, another radiation detector, or any combination thereof.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the disclosure and are not intended to limit the scope of what the inventors regard as their disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example 1: Single Crystal Growth

The raw chemicals used for preparing $Cs_2AgBiBr_6$ single crystals are cesium bromide (CsBr), bismuth bromide ($BiBr_3$), silver bromide (AgBr), and hydrobromic acid (HBr). For the growth of Bi-normal $Cs_2AgBiBr_6$ single crystals, 2.0 mmol CsBr and 1.0 mmol $BiBr_3$ were firstly dissolved in 10 mL HBr acid. Then 1.0 mmol AgBr was added to the solution. The mixing solution was briefly stirred and quickly placed on top of a hotplate, which has been pre-heated to 120° C. The solution temperature was held at 120° C. to dissolve all raw chemicals. Then it was decreased steadily at 2° C./hr to from 15-25° C. Crystals were harvested by pouring the solution out. To remove the possible chemical residues on crystal surfaces, the crystal was rinsed using ethanol and isopropanol.

For Bi-poor solution growth of $Cs_2AgBiBr_6$, the same process was followed, while only 0.8 mmol $BiBr_3$ was added to the synthesizing solution to form Bi-poor synthesizing conditions. For some experiments, Bi-poor solution growth used a second stoichiometry of reactants, with 2.0 mmol CsBr and 0.6 mmol $BiBr_3$ in 10 mL HBr solution, followed by addition of 1.0 mmol AgBr to the solution. The well-mixed solution was placed on a hotplate which was pre-heated to 120° C. Once all raw chemicals were dissolved, the temperature was decreased to room temperature at a rate of 2° C./h. $Cs_2AgBiBr_6$ crystals were harvested and washed with ethanol and isopropanol as described herein.

Figure 1B:
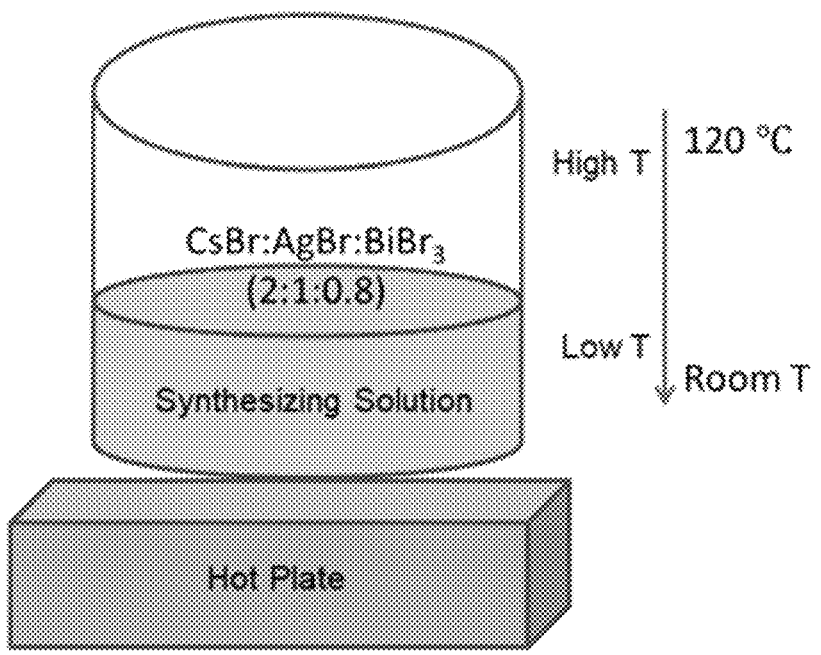
Figure 1C:
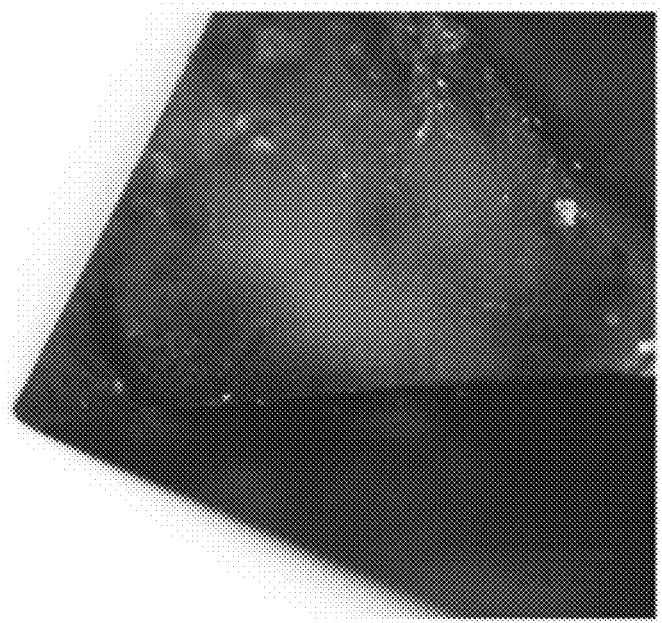
Figure 1D:
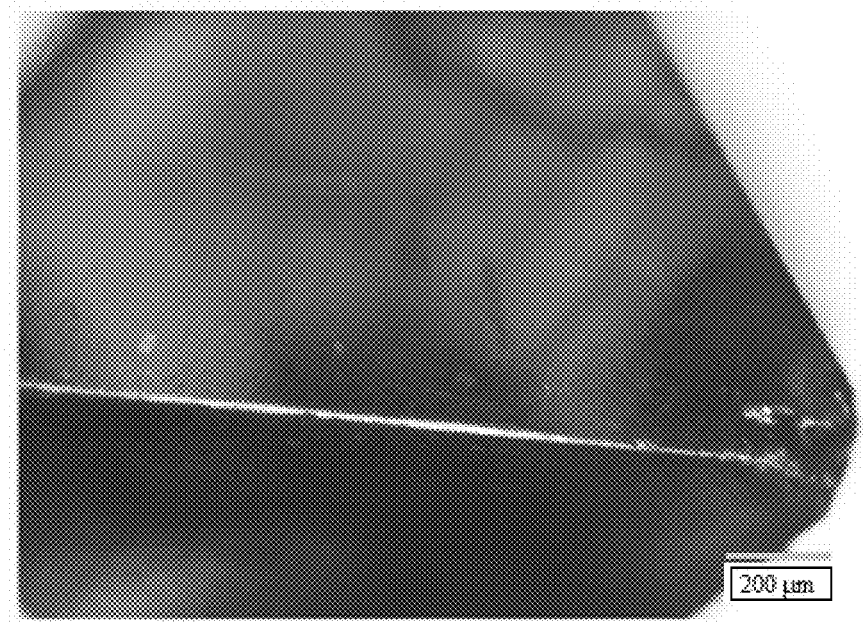

FIGS. 1A-1B schematically illustrate the Bi-normal and Bi-poor solution growth processes for $Cs_2AgBiBr_6$ single crystals. Crystals grown from Bi-normal and Bi-poor solutions are about 2×2×3 $mm^3$ large and present a red brown color. FIGS. 1C-1D show photographs of Bi-normal and Bi-poor $Cs_2AgBiBr_6$ single crystals under a Nikon optical microscope. An octahedral crystal shape with four crystal surfaces surrounding one peak point was observed. Single crystals grown from Bi-poor solutions seem to be more transparent compared with the ones synthesized from Bi-normal solutions.

Example 2: Crystal Characterization

Figure 2A:
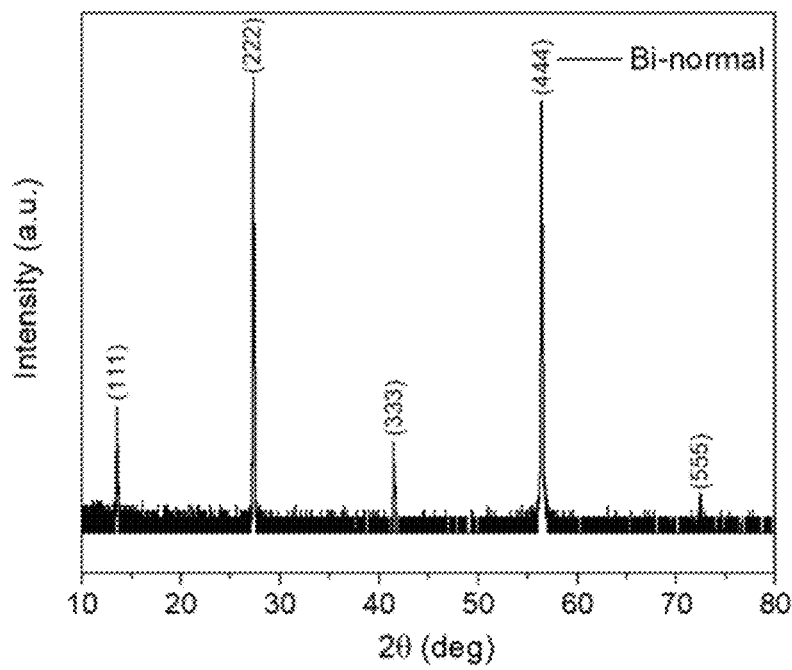
FIGS. 2A-2C show XRD patterns of as-grown (FIG. 2A) Bi-normal and (FIG. 2B) Bi-poor $Cs_2AgBiBr_6$ single crystals.
Figure 2B:
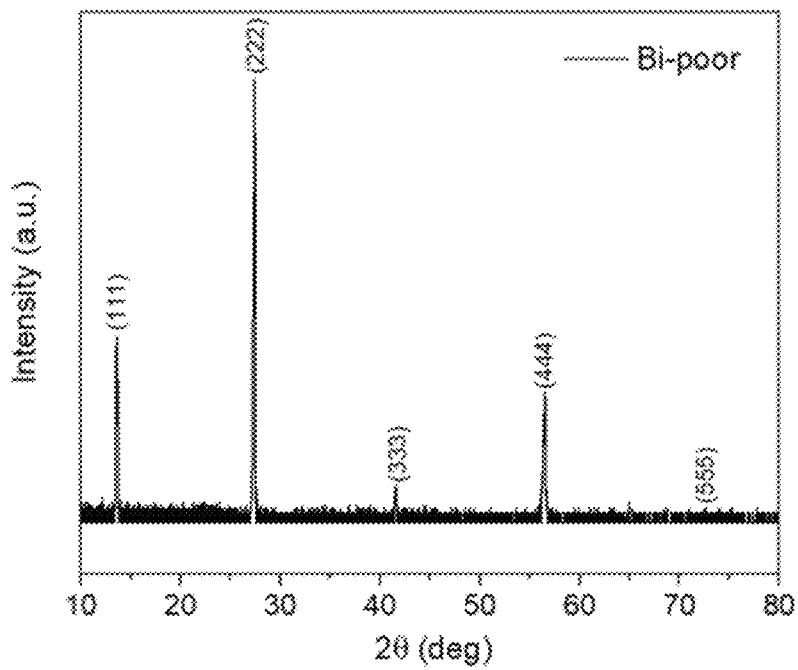
Figure 2C:
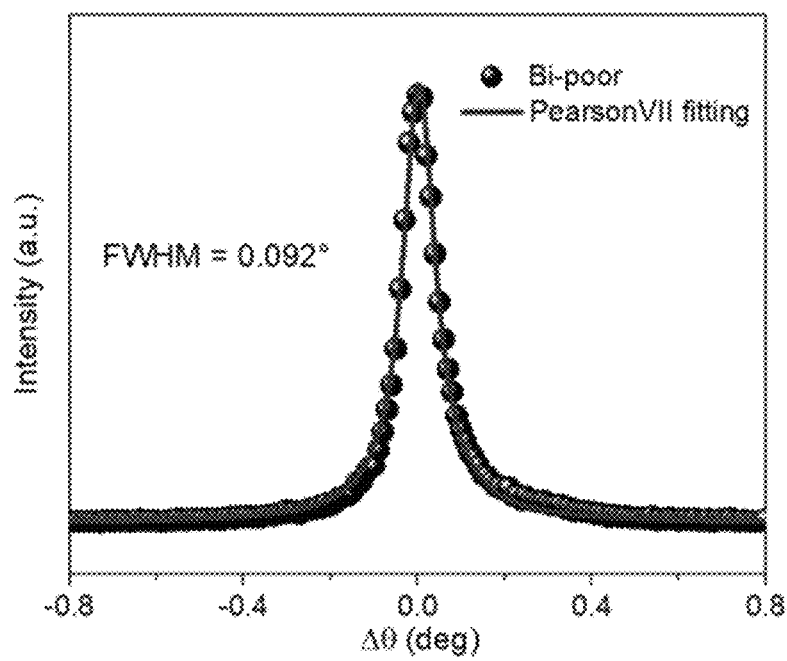

Before preparing $Cs_2AgBiBr_6$ single crystals for device fabrication, X-ray diffraction (XRD) measurements were performed for Bi-normal and Bi-poor single crystals (FIGS. 2A-2B). XRD data were acquired using a Rigaku SmartLab X-ray diffractometer with Cu Kα1 radiation (wavelength=1.5406 Å). Both XRD patterns showed that pure $Cs_2AgBiBr_6$ phase (ICSD collection #252164) was obtained with no presence of secondary phases. This indicates that both Bi-normal and Bi-poor solution growth processes should be able to produce high-quality $Cs_2AgBiBr_6$ single crystals. FIG. 2C shows the XRD omega scan for Bragg peak (111) using Bi-poor $Cs_2AgBiBr_6$ single crystals. Fitted by Pearson VII, the given full width at half maximum (FWHM) of the diffraction peak is 0.092°, which is better than single crystal $CsPbBr_3$ 0.16° and $MAPbI_3$ 0.3718°. The sharp peak indicates Bi-poor $Cs_2AgBiBr_6$ single crystal has excellent crystalline quality.

Figure 3A:
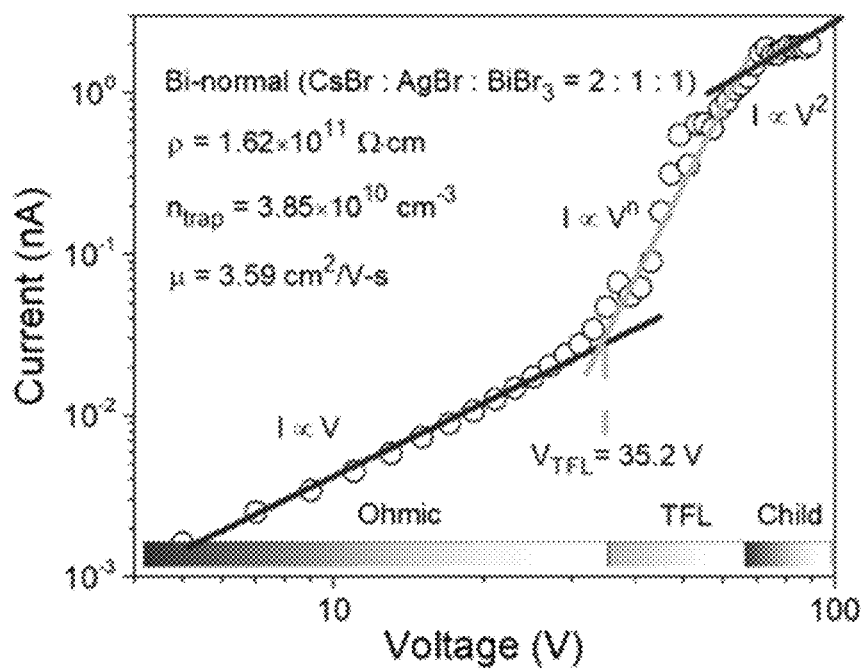
FIGS. 3A-3D show space-charge-limited current (SCLC) curves of (FIG. 3A) Bi-normal and (FIG. 3B) Bi-poor as-grown $Cs_2AgBiBr_6$ single crystals. The measurements were conducted at room temperature.
Figure 3B:
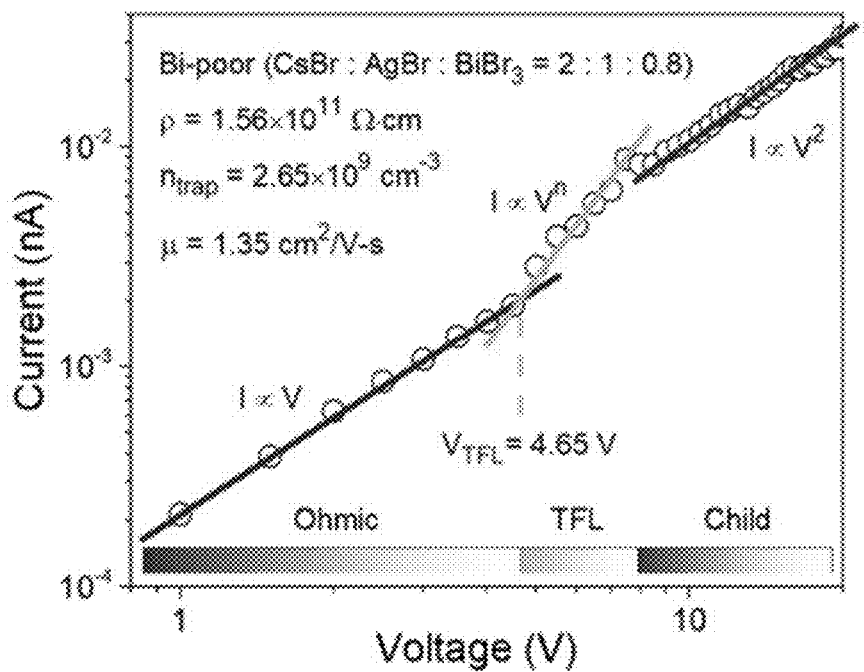

To compare the defect levels presenting in Bi-normal and Bi-poor $Cs_2AgBiBr_6$ single crystals, the space-charge-limited-current (SCLC) analysis was performed for the two types of single crystals (FIGS. 3A-3B). The results are summarized in Table 1. In the SCLC curve, there are three transition regimes, namely Ohmic, trap-filled limit (TFL) and child. In the Ohmic regime, the current is linearly proportional to the applied voltage. Therefore, the crystal resistivity (ρ) of Bi-normal and Bi-poor single crystals can be estimated, which are $1.62×10^{11}$ Ω·cm and $1.56×10^{11}$ Ω·cm, respectively. Such a high resistivity is essential for radiation detector fabrication as the leakage current, which serves as the source of detector noise, could be dramatically reduced.

In the TFL regime of the SCLC curve, all defect traps are filled. The onset voltage of TFL regime can be used to extract the density of trap states $n_{trap}$ using the equation below, $$n_{trap} = \frac{2\varepsilon\varepsilon_0}{eL^2} V_{TFL} \quad (1)$$

Here, ε (static dielectric constant) is taken as 16.73, $\varepsilon_0$ is the vacuum permittivity, and L is the crystal thickness. These results show that the density of traps states of Bi-poor $Cs_2AgBiBr_6$ single crystals is one order of magnitude lower than that of the Bi-normal $Cs_2AgBiBr_6$ single crystals. This is consistent with a previously published theoretical prediction for $Cs_2AgBiBr_6$. $Cs_2AgBiBr_6$ single crystals grown from Bi-poor solutions have a lower density of traps states of $2.65\times10^9$ cm$^{-3}$.

TABLE 1

SCLC Analysis for Two Types of Single Crystals

| Crystal Type | ρ (Ω · cm) | $n_{trap}$ (cm$^{-3}$) | μ (cm$^2$/V-s) |
|---|---|---|---|
| Bi-normal $Cs_2AgBiBr_6$ | $1.62 \times 10^{11}$ | $3.85 \times 10^{10}$ | 3.59 |
| Bi-poor $Cs_2AgBiBr_6$ | $1.56 \times 10^{11}$ | $2.65 \times 10^9$ | 1.35 |

If further increasing the applied bias, SCLC curve will enter the child regime. In the child regime, charge carrier mobility μ is no longer a function of intrinsic charge carrier concentration and could be estimated using the Mott-Gurney law, $$\mu = \frac{8J_D L^3}{9\varepsilon\varepsilon_0 V^2} \quad (2)$$

where L is again the crystal thickness and JD is the current density at applied bias voltage V. The mobility estimated for Bi-normal and Bi-poor $Cs_2AgBiBr_6$ single crystals is 3.59 cm$^2$/V-s and 1.35 cm$^2$/V-s, which is relatively low for radiation detector application. However, it is the μ-T product that ultimately determines the charge carrier drift distance and the charge collection efficiency (CCE). In general, a longer charge carrier drift distance λ (λ=μTE, where E is electric field) is desirable as that improves the charge collection efficiency.

Figure 3C:
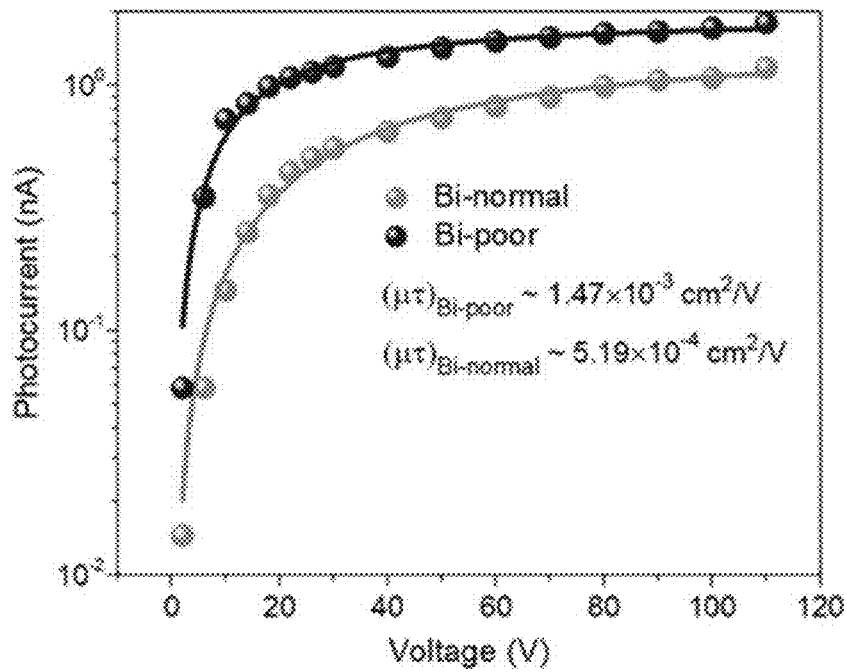

Therefore, the μ-T product for Bi-poor and Bi-normal $Cs_2AgBiBr_6$ single crystals was estimated, shown in FIG. 3C. The recorded photocurrent data was fitted by Many's equation or the modified Hecht model, $$I = \frac{I_0 \mu\tau V}{L^2} \frac{1 - \exp\left(\frac{L^2}{\mu\tau V}\right)}{1 + \frac{Ls}{V\mu}} \quad (3)$$

Here, s is the surface recombination velocity (cm/s). The determined μ-T product for Bi-poor $Cs_2AgBiBr_6$ single crystals is 1.47×10–3 cm$^2$/V, which is slightly lower than that of the leading semiconductor detector material CdZnTe single crystals (CdZnTe: ~10$^{-2}$ cm$^2$/V). Notably, it was observed that the μ-T product has been raised from 5.19× 10–4 cm$^2$/V for Bi-normal $Cs_2AgBiBr_6$ single crystals to 1.47×10–3 cm$^2$/V for crystals grown from Bi-poor solutions. Such an improvement indicated $Cs_2AgBiBr_6$ single crystals grown from Bi-poor solutions should have a preferable radiation detection performance compared with the Bi-normal ones.

For some experiments, after X-ray diffraction (XRD) was used to analyze the structure of fresh Bi-poor $Cs_2AgBiBr_6$ crystals, a high-temperature differential scanning calorimeter (DSC) was also employed to determine their high-temperature stability. The absorption spectroscopy measurement was used to determine the bandgap of as-grown crystals. As silver electrodes were deposited onto the two opposite sides of the Bi-poor $Cs_2AgBiBr_6$ single crystals, the fabricated devices were then used for the temperature-dependent resistivity measurements over the temperature range from 25° C. to 80° C. using a Keithley 6517b picoammeter/voltage source. 0.1 μCi Am-241 and 0.1 mCi Cs-137 radioactive sources were placed close to the fabricated detector for measuring the response of harvested Bi-poor $Cs_2AgBiBr_6$ crystals to ionizing radiation. LEDs operating at 568 nm were employed to test the photo response of $Cs_2AgBiBr_6$ before and after the annealing.

Example 3: Device Fabrication and Use

To characterize the Bi-normal and Bi-poor $Cs_2AgBiBr_6$ single crystals, carbon electrodes were deposited onto the two opposite sides of $Cs_2AgBiBr_6$ single crystal. The fabricated device is then used for space-charge-limited-current (SCLC) analysis and measurements of mobility-lifetime product. For gamma-ray detector fabrication, fast drying silver paste was brushed onto the two opposite sides of one ~1.5 mm thick single crystal. 0.1 μCi Am-241 radioactive source was placed close to the fabricated detector for recording the energy spectrum at room temperature.

Figure 3D:
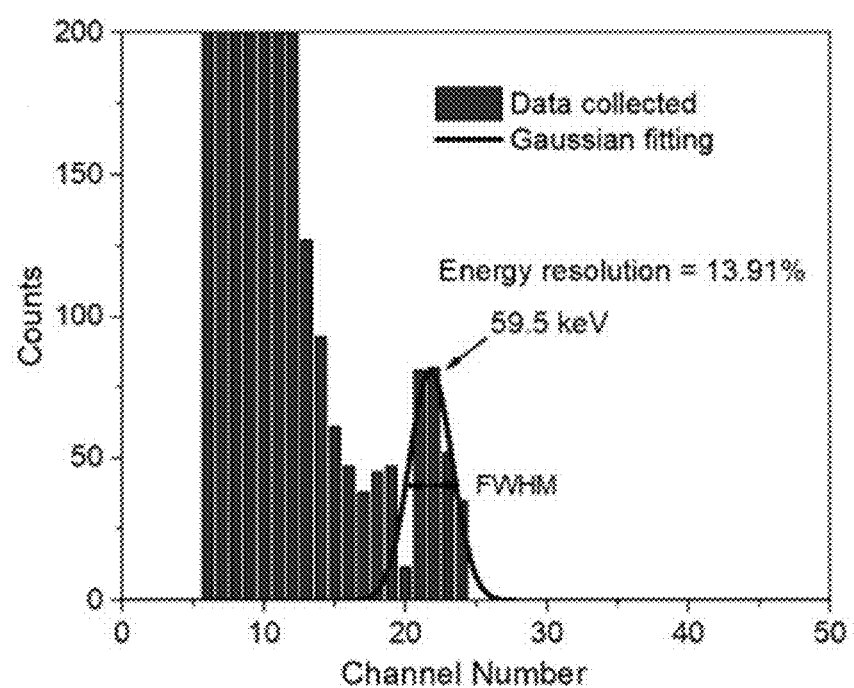
Figure 4:
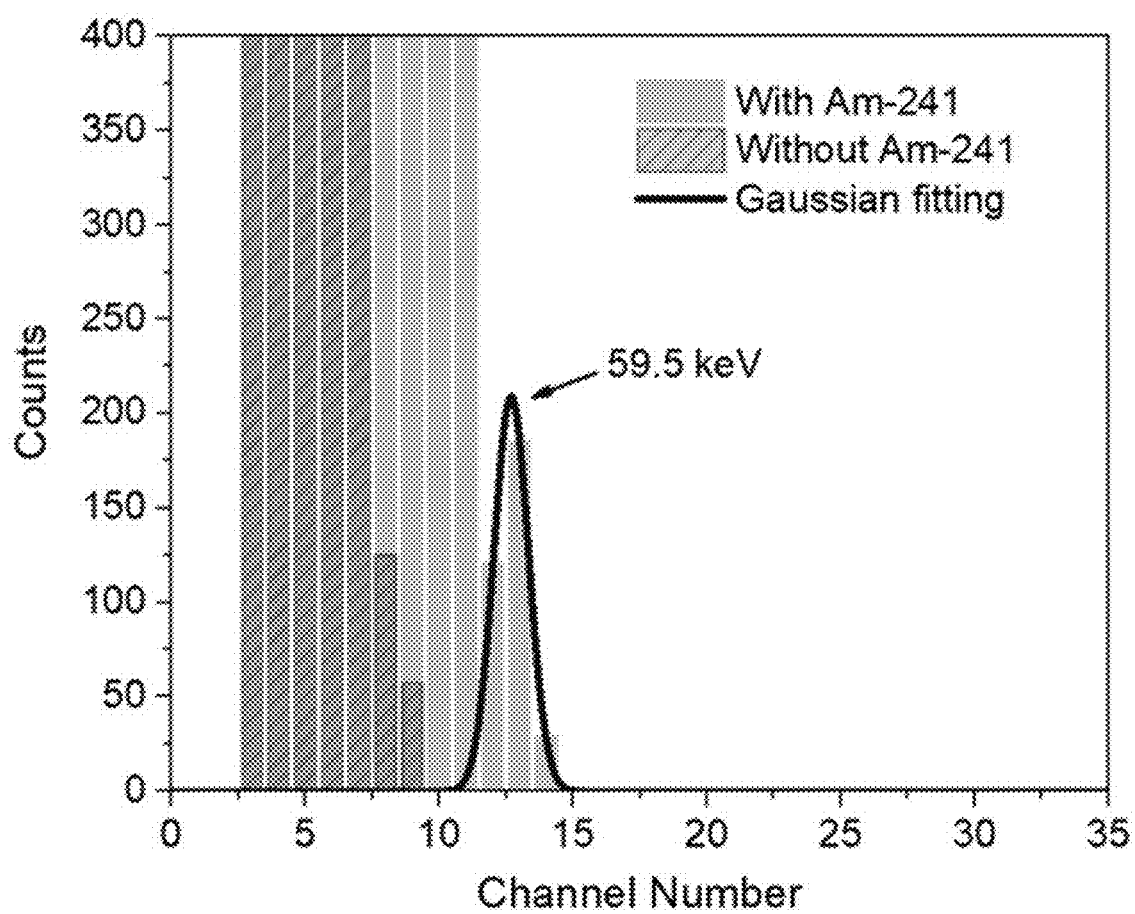
FIG. 4 shows the energy spectrum recorded by Bi-poor $Cs_2AgBiBr_6$ detectors with and without Am-241 radioactive source. The data were collected with shaping time of 2 µs and bias at 100 V. Also shown is the Gaussian fitting curve for 59.5 keV gamma-ray energy peak.
Figure 5:
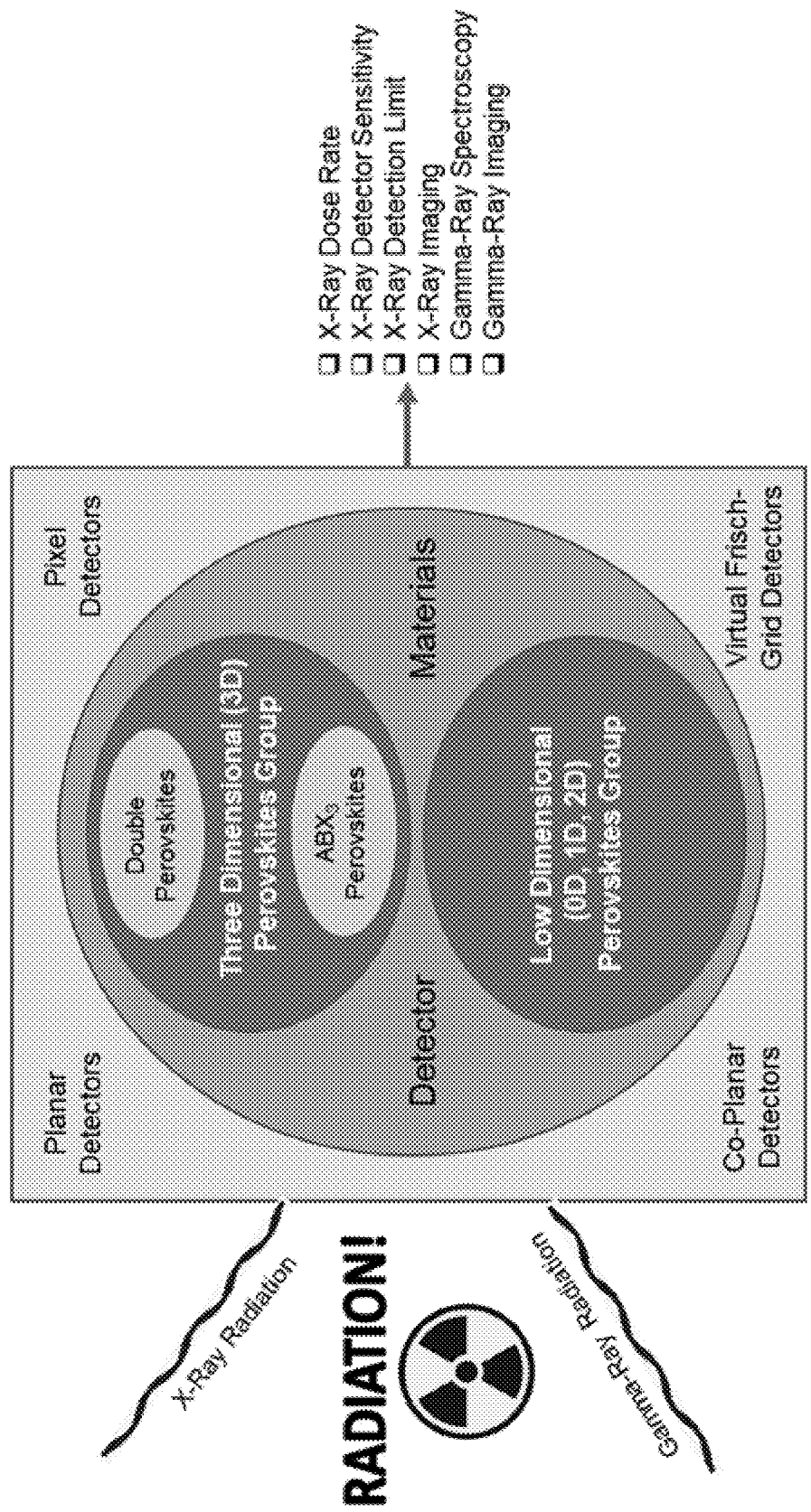
FIG. 5 shows a schematic of radiation detection according to the present disclosure including radiation types, detector types, detector materials, and applications.

FIG. 3D shows the energy spectrum recorded by a prototype gamma-ray detector based on Bi-poor $Cs_2AgBiBr_6$ single crystal. The 59.5 keV gamma-ray emitted from 0.1 μCi Am-241 radioactive source was resolved with an energy resolution of 13.91% (taken as the FWHM over peak centroid). FIG. 4 further compares the energy spectrum recorded by Bi-poor $Cs_2AgBiBr_6$-based detector with and without the presence of Am-241 radioactive source. The 59.5 keV energy peak becomes absent without Am-241 radioactive source. Moreover, it is interesting that $Cs_2AgBiBr_6$ single crystals grown from Bi-normal conditions did not show any response to 59.5 keV gamma-ray. Thus, the defects in $Cs_2AgBiBr_6$, especially the deep level electron traps (which should have been suppressed in Bi-poor solution growth conditions), are playing an important role in terms of gamma-ray detection performance. In Bi-normal $Cs_2AgBiBr_6$ single crystals, charge carriers excited by 59.5 keV gamma photons could have been trapped by high level defect sites and thus could not effectively move across the crystal to form a signal. These results indicate that $Cs_2AgBiBr_6$ single crystals grown from Bi-poor precursor solutions hold great potentials for the use as semiconductor gamma-ray detector materials and should be further explored.

In summary, two types of $Cs_2AgBiBr_6$ single crystals were successfully prepared from Bi-normal and Bi-poor solutions respectively. These results show that $Cs_2AgBiBr_6$ single crystals grown from Bi-poor conditions is preferable and has an order of magnitude lower density of trap states compared with that in $Cs_2AgBiBr_6$ single crystals grown from Bi-normal solutions. This work experimentally validates the theoretical prediction and shows that high-quality $Cs_2AgBiBr_6$ single crystals may be grown from Bi-poor precursor solutions. It was found that $Cs_2AgBiBr_6$ single crystals grown from Bi-poor solutions have a high μ-T product of 1.47×10³ cm²/V, which would be suitable for the further development of $Cs_2AgBiBr_6$ as next generation semiconductor-based radiation detector materials.

Example 4: Mechanical Properties of Bi-Poor Crystals

Figure 6A:
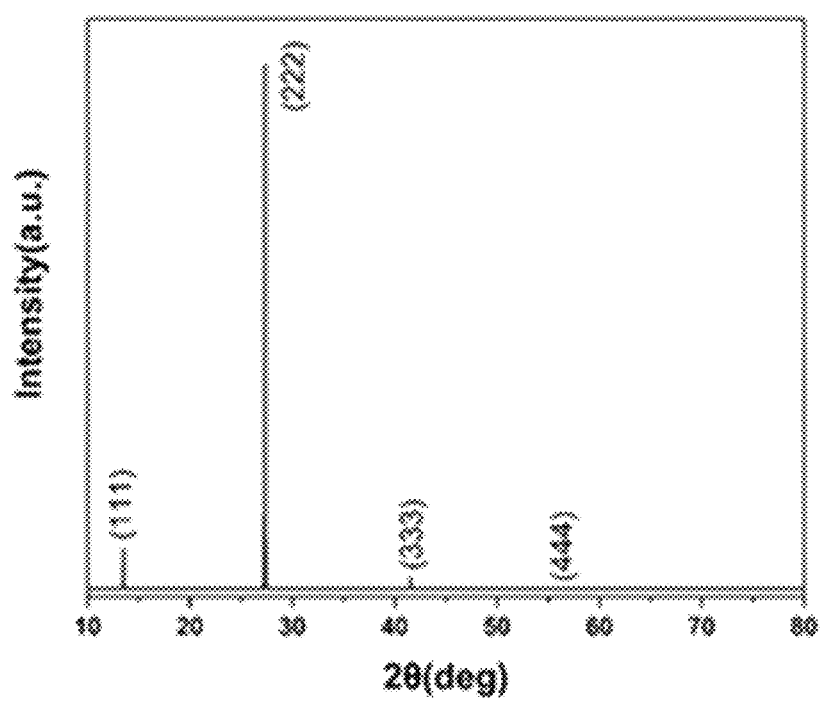
FIG. 6A shows XRD patterns of a Bi-poor $Cs_2AgBiBr_6$ single crystal.
Figure 6B:
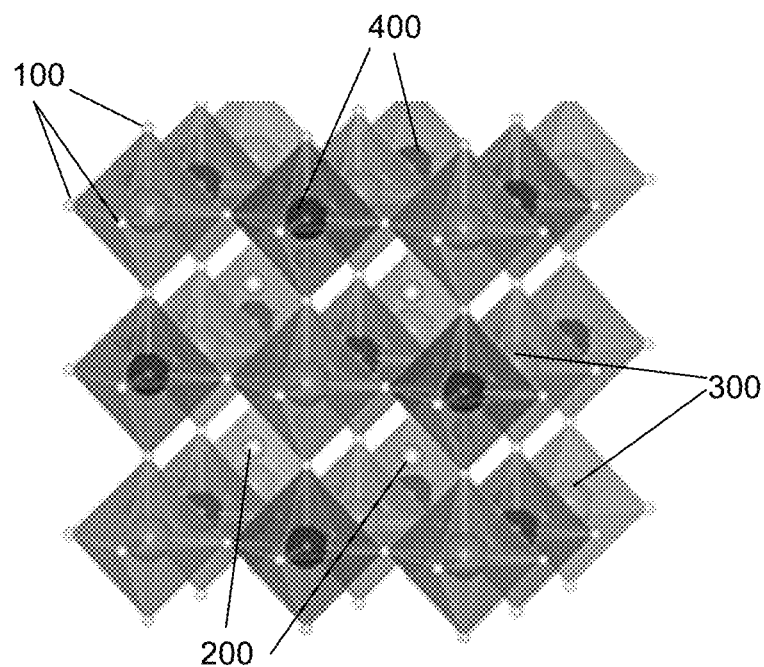
FIG. 6B shows representative crystal structure of $Cs_2AgBiBr_6$ single crystals.
Figure 6C:
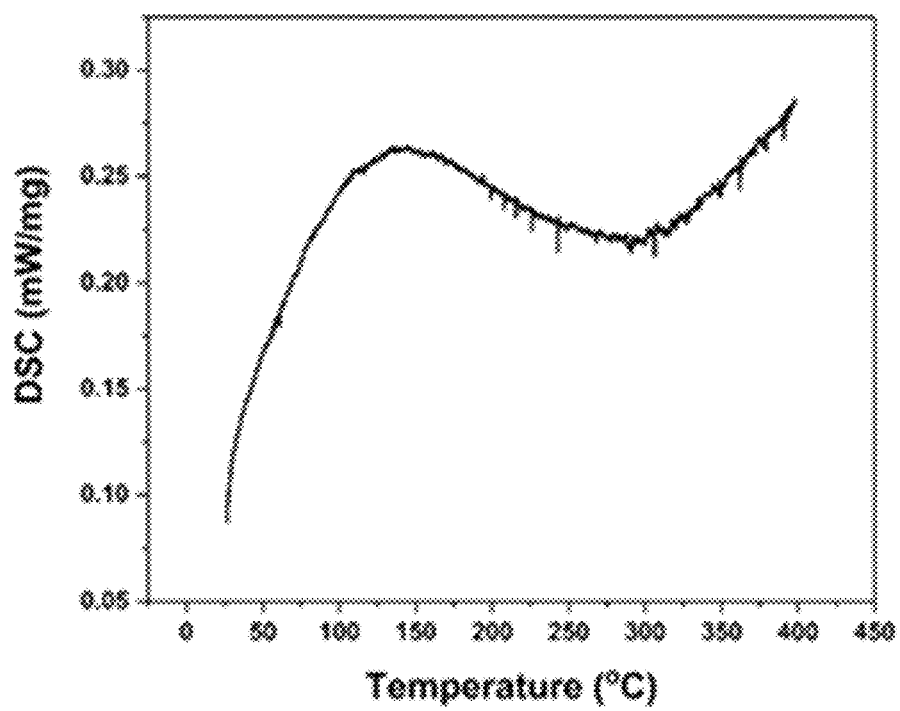
FIG. 6C shows DSC characterization of the $Cs_2AgBiBr_6$ single crystals.

X-ray diffraction (XRD) analysis, shown in FIG. 6A, revealed diffraction patterns from {111}peaks while the full-width at half-maximum (FWHM) of (222) diffraction reached 0.03°, which confirms the high crystallinity of as-grown Bi-poor $Cs_2AgBiBr_6$ crystals using the second stoichiometry described in Example 1. FIG. 6B shows the crystal structure $Cs_2AgBiBr_6$ single crystals with the VESTA software. Small spheres 100 represent Br⁻, medium spheres 200 represent Cs⁺, and light gray octahedrons 300 and dark gray octahedrons 400 represent $AgBr_6$ and $BiBr_6$ octahedra, respectively. The DSC result (FIG. 6C) demonstrates that there is no phase transition of Bi-poor $Cs_2AgBiBr_6$ single crystals up to 400° C. This is consistent with previous observations where no phase transitions of $Cs_2AgBiBr_6$ was present below 350° C. and 400° C., respectively, were reported.

Figure 6D:
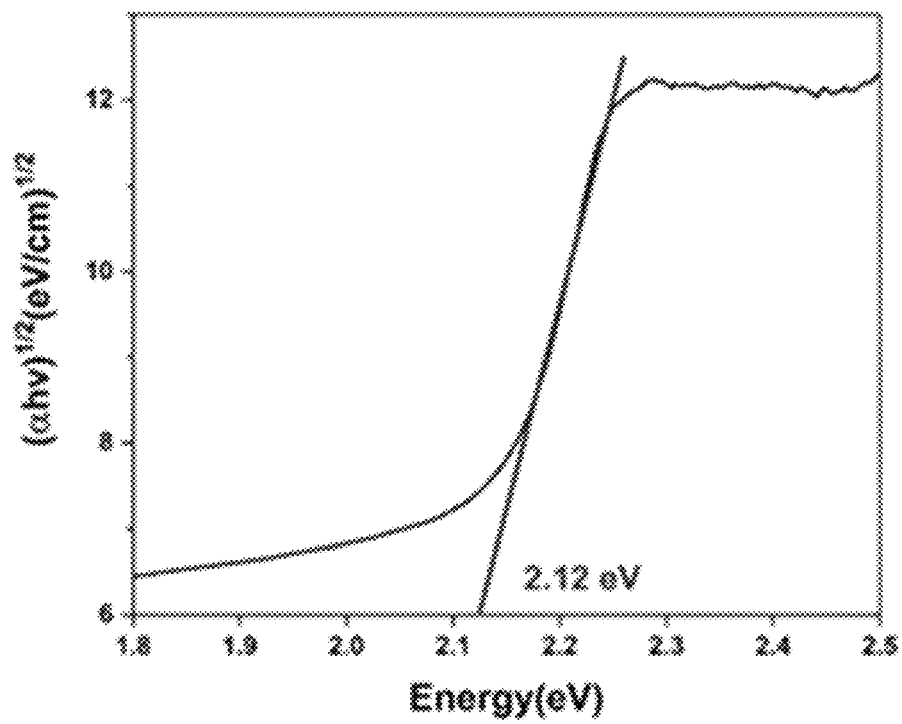
FIG. 6D shows dependence of $(\alpha h\nu)^{1/2}$ of $Cs_2AgBiBr_6$ single crystal upon the incident photon energy (hν).

Since the crystal bandgap can be determined using the Tauc plot, the relation between the absorption coefficient (α) and the incident photon energy (hv) could be established in the high absorption region of semiconductors:

$$(\alpha h v)^2 = \alpha_0 (h v - E_g) \tag{4}$$

where α is the optical absorption coefficient, which can be calculated from the absorbance (A) and thickness of the sample (d) using the equation α=2.303 A/d; and hv is the incident photon energy. The power factor (n) can take the values of 0.5, 2, 1.5, and 3 for allowed direct, allowed indirect, forbidden direct and forbidden indirect transitions. Here, n takes 2 due to the allowed indirect transition of $Cs_2AgBiBr_6$. Therefore, the calculated bandgap of Bi-poor $Cs_2AgBiBr_6$ single crystals is around 2.12 eV as shown in FIG. 6D, which is consistent with previous reports.

Figure 7:
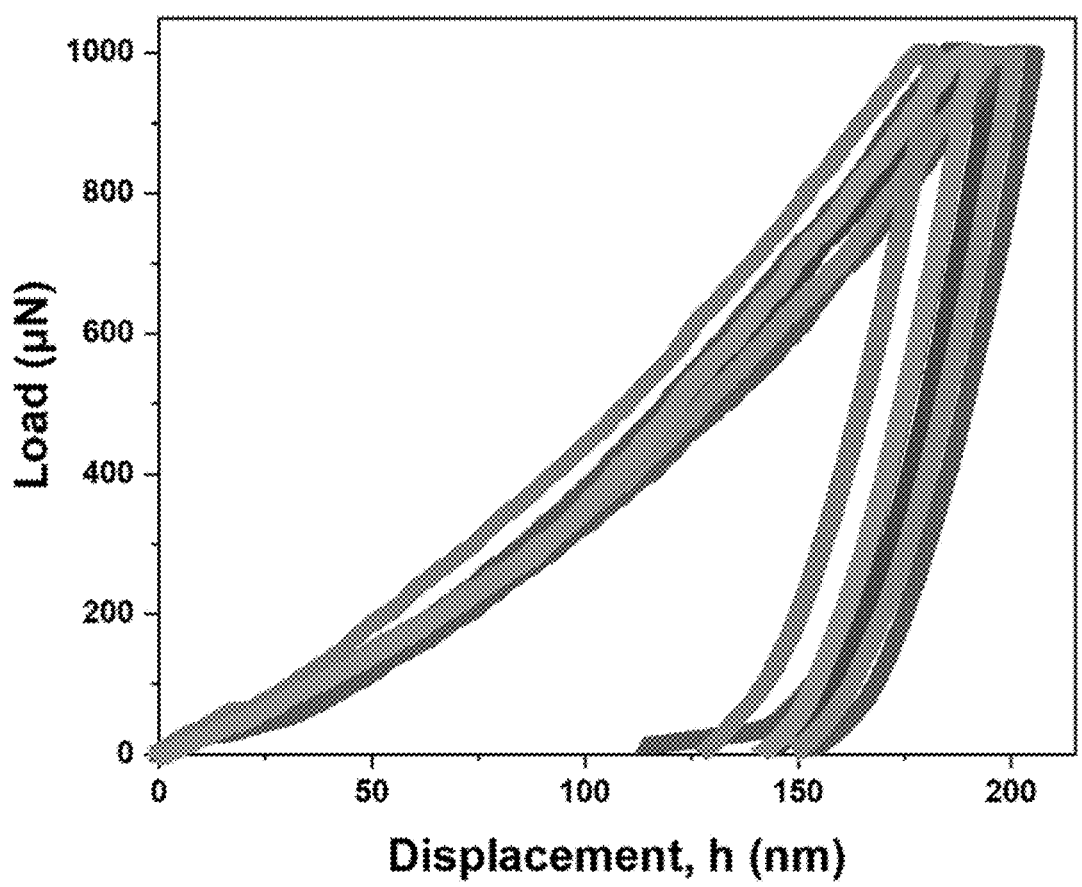
FIG. 7 shows representative load-indentation depth (P-h) curves were obtained with indentation normal to the (111) plane of Bi-poor $Cs_2AgBiBr_6$ single crystal.

High mechanical properties are always an encouraging factor for the fabrication, packaging, and stable in-service operation of perovskite-based devices. Here, nanoindentation measurements were performed to study elastic properties of Bi-poor $Cs_2AgBiBr_6$ crystals. First, the (111) plane of Bi-poor $Cs_2AgBiBr_6$ crystal was well identified by XRD at room temperature. After calibrating with a fused quartz, three nanoindentation measurements were conducted with a Berkovich tip when the indenter axis was aligned perpendicular to the (111) plane of super glued crystals. With the peak load force at 1 mN and 5 mN, the loading/unloading time and the holding time at peak loads were maintained at 10 s and 5 s, respectively. FIG. 7 shows the typical load control displacement curve for the (111) plane of Bi-poor $Cs_2AgBiBr_6$ crystals. To summarize the results from three nanoindentation experiments, Table 2 provides the experimental values of Young's modulus (E) and hardness (H) based on nearly 30 indenting points from three different sampling areas and different loads. The overall results manifest that, at room temperature, the Young's modulus and hardness of Bi-poor $Cs_2AgBiBr_6$ are around 32 GPa and 1 GPa, separately. The experimental results are in reasonable agreement with the reported values of other groups, where E and H for normal stoichiometric $Cs_2AgBiBr_6$ are 23 GPa and 0.7 GPa. As the Young's modulus and hardness of $MAPbX_3$ (MA=methylammonium, X=Br, I, Cl) and $CsPbBr_3$ are below 20 GPa and 0.6 GPa, respectively, it indicates $Cs_2AgBiBr_6$ could exhibit superior mechanical characteristics compared with them, suggesting a promising aspect of Bi-poor $Cs_2AgBiBr_6$ single crystal when being used as functional devices.

TABLE 2

Summary of Experimental Values of Young's Modulus (E) and Hardness (H) for Bi-Poor Crystals

| Bi-poor $Cs_2AgBiBr_6$ | E (GPa) | Standard Dev. (GPa) | H (GPa) | Standard Dev. (GPa) |
|---|---|---|---|---|
| Sampling area 1 | 31.45 | 2.97 | 0.92 | 0.20 |
| Sampling area 2 | 33.08 | 1.35 | 1.11 | 0.10 |
| Sampling area 3 | 31.51 | 5.21 | 1.02 | 0.26 |

Example 5: Resistivity of Bi-Poor Single Crystals at Various Temperatures

Figure 8A:
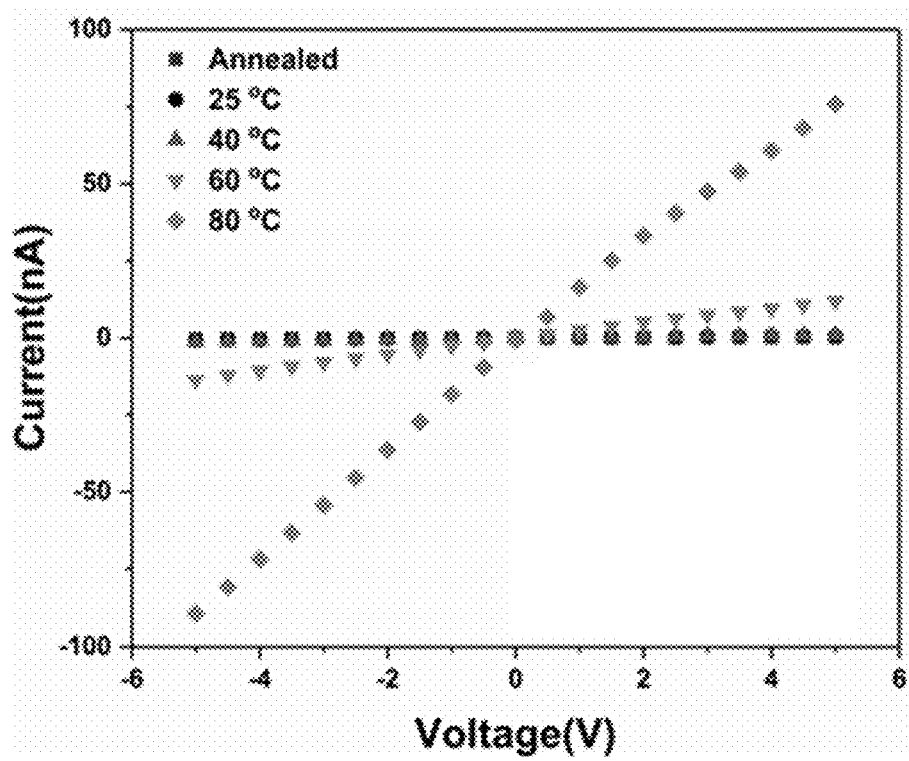
FIGS. 8A-8B show I-V characteristic curves of a Bi-poor $Cs_2AgBiBr_6$ single crystal at different temperatures. Resistivity decreases with increasing temperatures and curves fit well with the Steinhart and Hart equation (FIG. 8B).
Figure 8B:
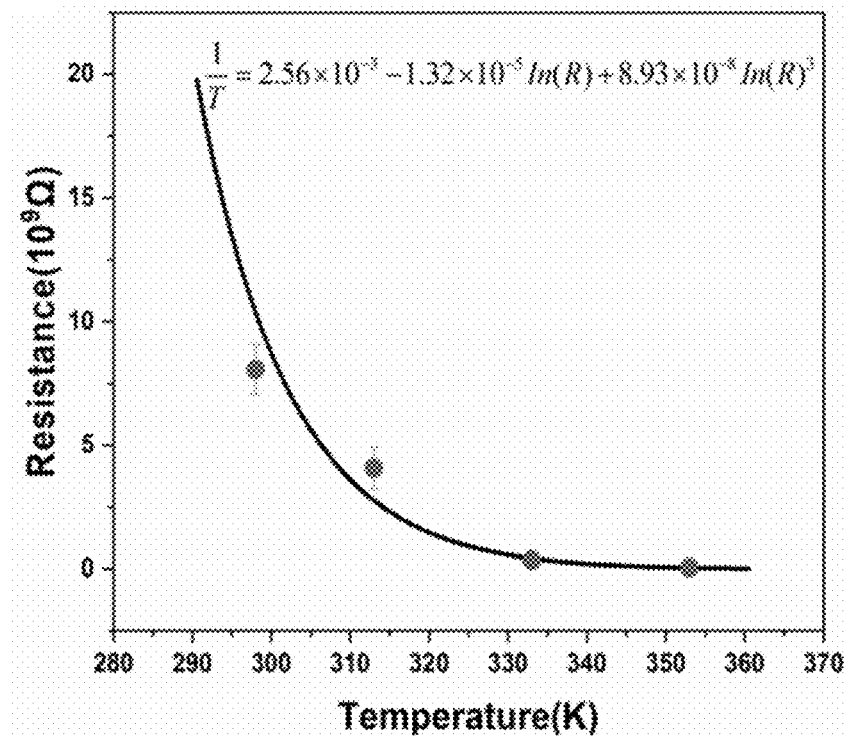

Under open air environment, current-voltage (I-V) measurements were conducted at several targeted temperatures, i.e., room temperature (~25° C.), 40° C., 60° C., and 80° C., to investigate the temperature-dependent performance of Bi-poor $Cs_2AgBiBr_6$ single crystals. As shown in FIGS. 8A-8B, the dependence of the current as a function of the applied voltage (−5 V to 5 V) exhibits an excellent linear relationship over this wide temperature range. It demonstrates that silver electrodes and Bi-poor $Cs_2AgBiBr_6$ single crystal formed and maintained ohmic contacts even when the temperature increased. The estimated values of resistivity are 8.07×10⁹ Ω·cm, 4.07×10⁹ Ω·cm, 3.58×10³ Ω·cm, and 5.86×10¹ Ω·cm respectively at the above testing temperatures. As expected, the resistivity decreases with increasing temperatures. Furthermore, the curves fit well with the Steinhart and hart equation, as shown in FIG. 8B.

Since the temperature-dependent resistivity measurements had lasted for 3 hours with the temperature increased from the room temperature to 80° C., an annealing effect could occur on the measured Bi-poor $Cs_2AgBiBr_6$ crystals. Therefore, further analysis was performed to understand the effect of such annealing process on the as-grown Bi-poor $Cs_2AgBiBr_6$ single crystal.

Figure 9:
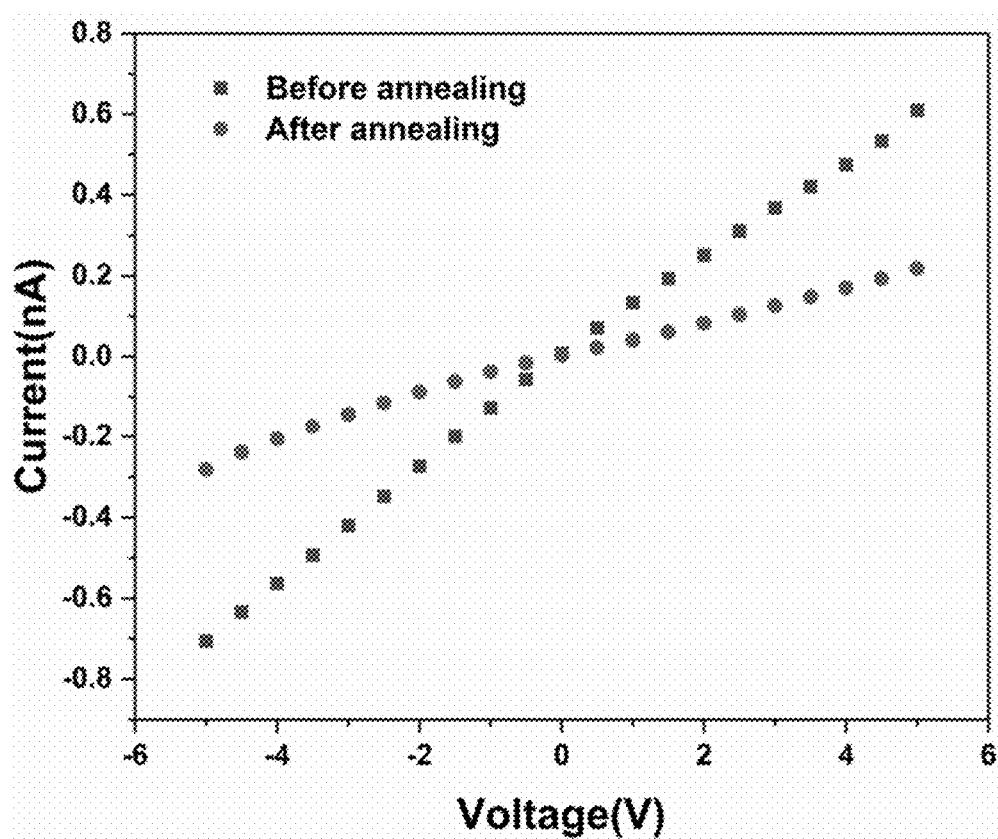
FIG. 9 shows I-V characteristic curves of a Bi-poor $Cs_2AgBiBr_6$ single crystal before and after annealing.

In general, the electrical resistivity of the crystals, ρ, can be estimated using the I-V characteristic:

$$\rho = \frac{R \times A}{L} = \frac{\frac{V}{I} \times A}{L} \tag{5}$$

where R, V, I are the resistance (Ω), voltage (V), and current (A), respectively. L is the detector thickness (cm) and A is the cross-sectional area. In this case, a representative sample with a dimension of 5 mm×2 mm×1 mm was used. It should be noted that each data point is based on the average value from several repeated measurements. As depicted in FIG. 9, the resistivity after annealing was found to increase from 8.07×10⁹ Ω·cm to 2.13×10¹⁰ Ω·cm, which is nearly three times higher than the original value.

Example 6: Photocurrents Under Irradiation from Radiation Sources

In order to investigate the annealing effect on radiation response, photocurrent measurements were conducted using 0.1 μCi Am-241 and 0.1 mCi Cs-137 radioactive sources.

Figure 10A:
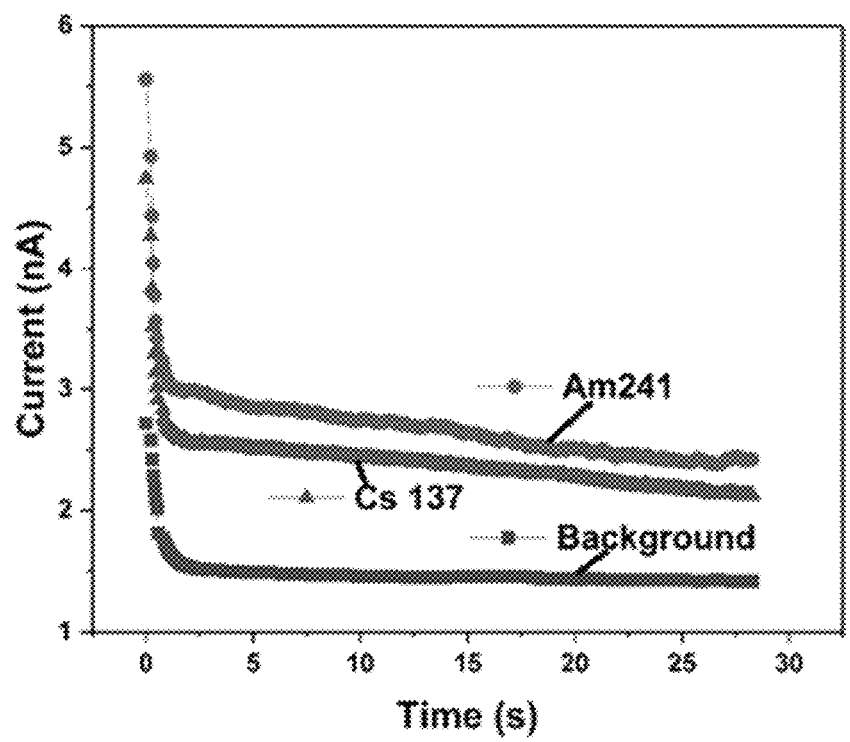
FIGS. 10A-10B show photocurrent response of Bi-poor $Cs_2AgBiBr_6$-based detector to Am-241 and Cs-137 radiation sources before (FIG. 10A) and after (FIG. 10B) high-temperature measurement (annealing); the photocurrent measurements were conducted at room temperature, and the bias is +10V.
Figure 10B:
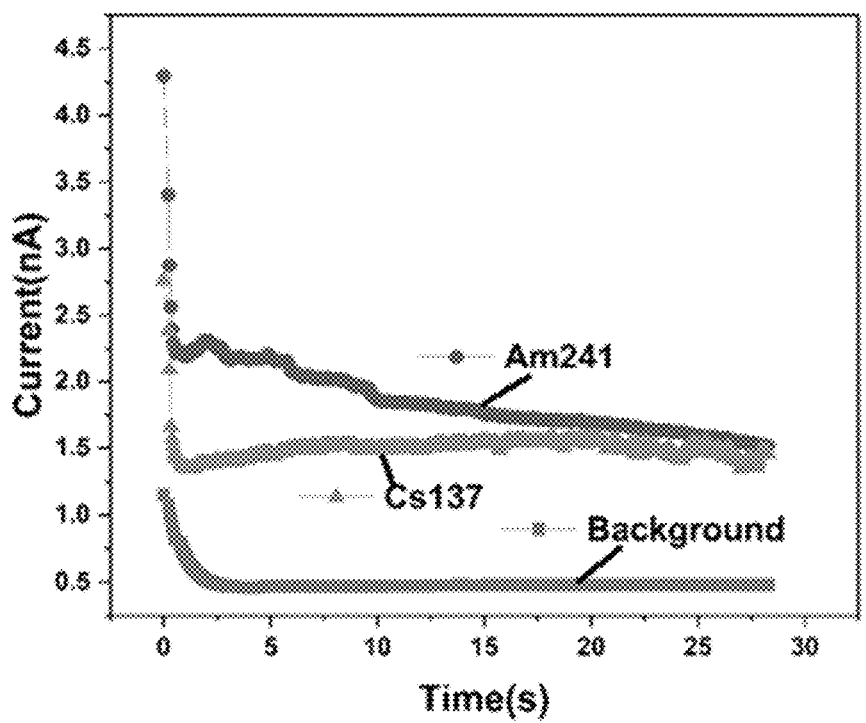

Before and after the high-temperature measurement (annealing), the Bi-poor $Cs_2AgBiBr_6$ single crystal showed a significant response to these radiation sources at bias +10 V, as displayed in FIGS. 10A-10B. Under the irradiation from the sources, the photocurrent was enhanced nearly 2 times compared with the background current before annealing, while the photocurrent increased 3 times after annealing. Obviously, the background photocurrent after annealing is lower than the value before annealing. This trend is consistent with the increase of the resistivity. Even after the annealing, the Bi-poor $Cs_2AgBiBr_6$ crystal still holds a strong response to the radiation sources. It implies the excellent thermal and air stability of Bi-poor $Cs_2AgBiBr_6$ single crystals.

Example 7: Temporal Response Under 568 nm LED Illumination

Figure 11:
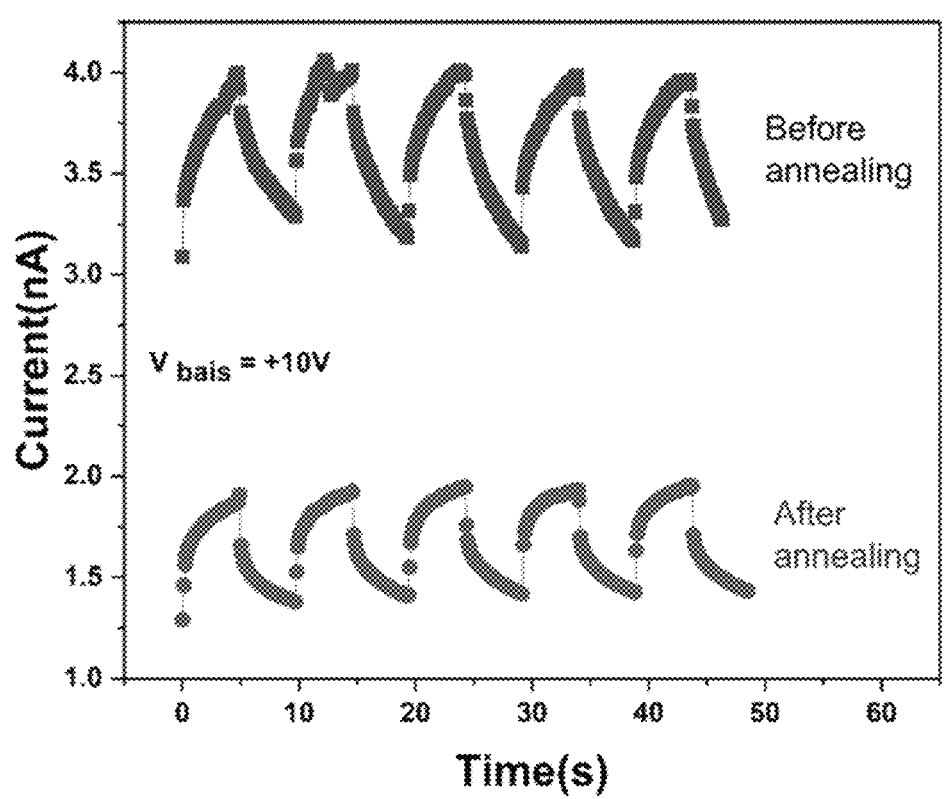
FIG. 11 shows response of Ag/$Cs_2AgBiBr_6$/Ag device to the LED light with a wavelength at 568 nm before and after annealing.

The temporal response of Bi-poor $Cs_2AgBiBr_6$ crystal before and after annealing was studied to understand the annealing effect. At an applied voltage of +10 V, the fabricated $Cs_2AgBiBr_6$ device was tested using an LED light of 568 nm. As depicted in FIG. 11, the device responded strongly to the LED light of 568 nm even after the annealing.

To further study the temporal mechanism, the rising and decaying processes of the photocurrent were fitted exponentially with the equation below, where the time constant (Ti) indicates photocarrier relaxation:

$$I = A\exp(-t/\tau_1) \quad (6)$$

where A is the constant, t is time (s), and I is the current (nA).

Figure 12A:
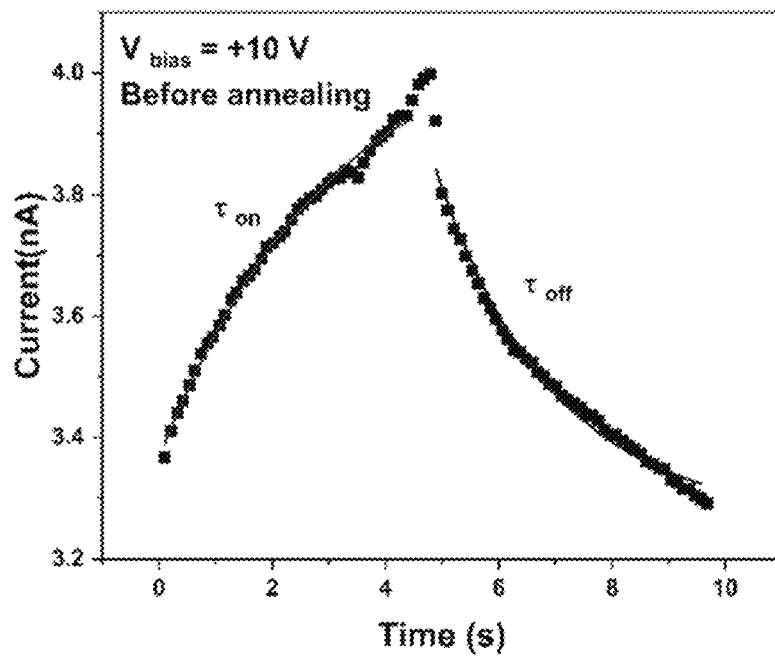
FIGS. 12A-12B show the decaying and rising characteristics of the photocurrent curves and the fitted exponentially curves of the Ag/$Cs_2AgBiBr_6$/Ag device at 10 V bias before (FIG. 12A) and after (FIG. 12B) annealing.
Figure 12B:
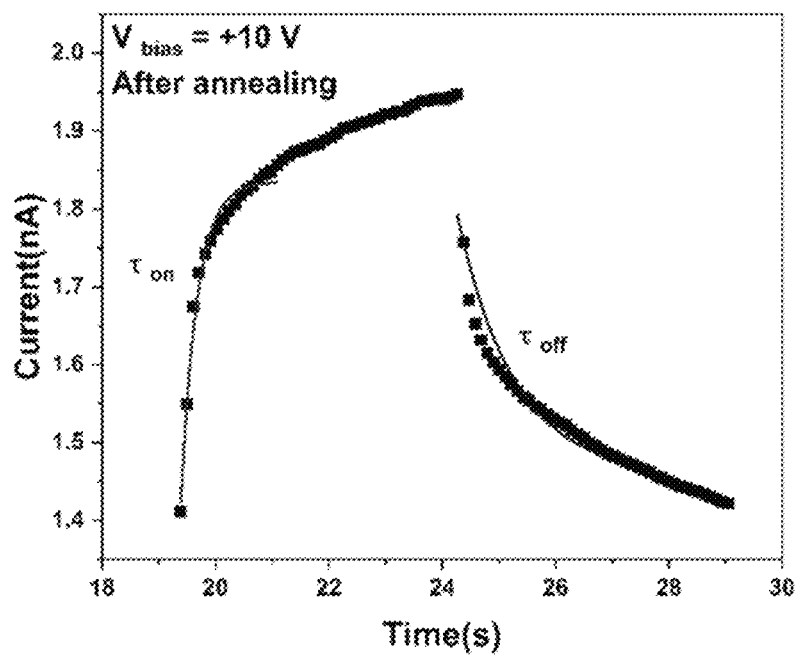

As shown in FIGS. 12A-12B, the rising and decaying time can be determined by fitting the curve. As summarized in Table 3, the rising response times before high-temperature treatment are $\tau_{on}$=2.16 s, and the decaying response times are $\tau_{off}$=2.20 s. However, the rising response times after high-temperature treatment are $\tau_{on}$=0.53 s, and the decaying response times are $\tau_{off}$=1.57 s, both of which are much shorter than the value before annealing. The results indicate that annealing could play an important role in tuning the decay- and rise-time characteristics of Bi-poor $Cs_2AgBiBr_6$ single crystals. This could offer useful information for developing $Cs_2AgBiBr_6$-based photodetectors. The faster time response could be attributed to the reduction of charge trap density caused by the annealing process.

TABLE 3

Calculated Photoelectrical Parameters of the Ag/$Cs_2AgBiBr_6$/Ag Device

| Samples | Rising time (s) | Error (s) | Falling time (s) | Error (s) |
|---|---|---|---|---|
| Before annealing | 2.16 | 0.78 | 2.20 | 0.48 |
| After annealing | 0.53 | 0.11 | 1.57 | 0.37 |

In summary, Bi-poor $Cs_2AgBiBr_6$ single crystals were grown, and the effect of annealing on their electrical properties and detector response were evaluated. The resistivity increased nearly 3 times after the annealing at the temperature up to 80° C. Moreover, the fabricated device exhibited a strong response to both radiation sources and LED illumination of 568 nm before and after the annealing. A faster response was also observed for the annealed crystal. These results demonstrate a robust thermal and air stability of Bi-poor $Cs_2AgBiBr_6$. Furthermore, annealing shows a great potential in controlling electric properties and temporal response of Bi-poor $Cs_2AgBiBr_6$ single crystals. Further study is encouraged to optimize the annealing conditions for maximizing the performance of $Cs_2AgBiBr_6$ single crystals.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

REFERENCES

1. Ali, R., et al. (2018). Predicted lead-free perovskites for solar cells. Chemistry of Materials, 30(3), 718-728.
2. Bolotnikov, A. E. et al, Material Properties Limiting the Performance of CZT Gamma-Ray Detectors, 2009.
3. Bube, R. H. Trap Density Determination by Space-Charge-Limited Currents. J. Appl. Phys. 1962, 33 (5), 1733-1737.
4. Chu, L., et al. (2019). Lead-free halide double perovskite materials: A new superstar toward green and stable optoelectronic applications. Nano-Micro Letters, 11(1), 1-18
5. Del Sordo, S. et al, Progress in the Development of CdTe and CdZnTe Semiconductor Radiation Detectors for Astrophysical and Medical Applications. Sensors 2009, 9 (5), 3491-3526.
6. Dong, L., et al. (2018). Elastic properties and thermal expansion of lead-free halide double perovskite $Cs_2AgBiBr_6$. Computational Materials Science, 141, 49-58.
7. Dong, Q. et al, Electron-Hole Diffusion Lengths >175 μm in Solution-Grown $CH_3NH_3PbI_3$ Single Crystals. Science. 2015, 347 (6225), 967-970.
8. Feng, Y. et al, Low Defects Density CsPbBr3 Single Crystals Grown by an Additive Assisted Method for Gamma-Ray Detection. J. Mater. Chem. C 2020, 8 (33), 11360-11368.
9. Fritzsche, H., et al. (1974). Amorphous and liquid semiconductors. Plenum Press, New York, 1974) p, 254.
10. Gao, W., et al. (2018). High-Quality $Cs_2AgBiBr_6$ Double Perovskite Film for Lead-Free Inverted Planar Heterojunction Solar Cells with 2.2% Efficiency. ChemPhysChem, 19(14), 1696-1700.
11. Greul, E., et al. (2017). Highly stable, phase pure $Cs_2AgBiBr_6$ double perovskite thin films for optoelectronic applications. Journal of Materials Chemistry A, 5(37), 19972-19981.
12. Guo, L., et al. (2012). High responsivity ZnO nanowires based UV detector fabricated by the dielectrophoresis method. Sensors and Actuators B: Chemical, 166, 12-16.
13. Hassanien, A. S., et al. (2016). Effect of Se addition on optical and electrical properties of chalcogenide CdSSe thin films. Superlattices and Microstructures, 89, 153-169.
14. He, Y. et al, High Spectral Resolution of Gamma-Rays at Room Temperature by Perovskite CsPbBr3 Single Crystals. Nat. Commun. 2018, 9 (1), 1-8.
15. Hoye, R. L. Z. et al, Fundamental Carrier Lifetime Exceeding 1 μs in Cs2AgBiBr6 Double Perovskite. Adv. Mater. Interfaces 2018, 5 (15), 1800464.
16. Ji, F. et al, Lead-Free Halide Double Perovskite Cs2AgBiBr6 with Decreased Band Gap. Angew. Chemie—Int. Ed. 2020, 59 (35), 15191-15194.

17. Jia, L., et al. (2020). Vacuum-ultraviolet photodetectors. PhotoniX, 1(1), 1-25.
18. Knoll, G. F. Radiation Detection and Measurement, John Wiley, 2010.
19. Li, T. et al, Intrinsic Defect Properties in Halide Double Perovskites for Optoelectronic Applications. Phys. Rev. Appl. 2018, 10 (4), 041001.
20. Liu, Y. et al, Two-Inch-Sized Perovskite CH3NH3PbX3 (X=Cl, Br, I) Crystals: Growth and Characterization. Adv. Mater. 2015, 27 (35), 5176-5183.
21. Lun, Y., et al. (2021). Elastic Properties of Photovoltaic Single Crystal $Cs_2AgBiBr_6$. Experimental Mechanics, 1-7.
22. McClure, E. T., et al. (2016). $Cs_2AgBiX_6$ (X=Br, Cl): new visible light absorbing, lead-free halide perovskite semiconductors. Chemistry of Materials, 28(5), 1348-1354.
23. Momma, K. et al, "VESTA 3 for three-dimensional visualization of crystal, volumetric and morphology data," J. Appl. Crystallogr., 44, 1272-1276 (2011).
24. Owens, A. Compound Semiconductor Radiation Detectors; CRC Press, 2016.
25. Owens, A., et al. (2004). Compound semiconductor radiation detectors. Nuclear Instruments and Methods in Physics Research Section A: Accelerators, Spectrometers, Detectors and Associated Equipment, 531(1-2), 18-37.
26. Pan, W., et al. (2017). $Cs_2AgBiBr_6$ single-crystal X-ray detectors with a low detection limit. Nature photonics, 11(11), 726-732.
27. Pan, W. et al, Development of Halide Perovskite Single Crystal for Radiation Detection Applications. Front. Chem. 2020, 8, 268.
28. Prokesch, M. et al, CdZnTe Detectors for Gamma Spectroscopy and X-Ray Photon Counting at 250×10$^6$ Photons/(mm$^2$s). J. Appl. Phys. 2018, 124 (4), 44503.
29. Rakita, Y., et al. (2015). Mechanical properties of APbX3 (A=Cs or CH3NH3; X=I or Br) perovskite single crystals. Mrs Communications, 5(4), 623-629.
30. Schade, L. et al, Structural and Optical Properties of Cs2AgBiBr6 Double Perovskite. ACS Energy Lett. 2019, 4 (1), 299-305.
31. Slavney, A. H. et al, A Bismuth-Halide Double Perovskite with Long Carrier Recombination Lifetime for Photovoltaic Applications. J. Am. Chem. Soc. 2016, 138 (7), 2138-2141.
32. Steele, J. A. et al, Giant Electron-Phonon Coupling and Deep Conduction Band Resonance in Metal Halide Double Perovskite. ACS Nano 2018, 12 (8), 8081-8090.
33. Stoumpos, C. C. et al, Crystal Growth of the Perovskite Semiconductor CsPbBrs: A New Material for High-Energy Radiation Detection. Cryst. Growth Des. 2013, 13 (7), 2722-2727.
34. Targhi, F. F. et al, MAPbI3 and FAPbI3 Perovskites as Solar Cells: Case Study on Structural, Electrical and Optical Properties. Results Phys. 2018, 10, 616-627.
35. Wang, X., et al. (2019). All-inorganic lead-free perovskites for optoelectronic applications. Materials chemistry frontiers, 3(3), 365-375.
36. Wei, H. et al, Dopant Compensation in Alloyed CH3NH3PbBr3-xClx Perovskite Single Crystals for Gamma-Ray Spectroscopy. Nat. Mater. 2017, 16 (8), 826-833.
37. Yakunin, S. et al, Detection of Gamma Photons Using Solution-Grown Single Crystals of Hybrid Lead Halide Perovskites. Nat. Photonics 2016, 10 (9), 585-589.
38. Yang, B. et al, Heteroepitaxial Passivation of Cs2AgBiBr6 Wafers with Suppressed Ionic Migration for X-Ray Imaging. Nat. Commun. 2019, 10 (1), 1-10.
39. Yang, J. et al, Stable, High-Sensitivity and Fast-Response Photodetectors Based on Lead-Free Cs2AgBiBr6 Double Perovskite Films. Adv. Opt. Mater. 2019, 7 (13), 1801732.
40. Zhang, H., et al. (2020). Encapsulated X-ray detector enabled by all-inorganic lead-free perovskite film with high sensitivity and low detection limit. IEEE Transactions on Electron Devices, 67(8), 3191-3198.
41. Zhang, M. et al, Growth and Characterization of All-Inorganic Lead Halide Perovskite Semiconductor CsPbBr3 Single Crystals. CrystEngComm 2017, 19 (45), 6797-6803.
42. Zhang, X., et al. (2016). Bright perovskite nanocrystal films for efficient light-emitting devices. The journal of physical chemistry letters, 7(22), 4602-4610.
43. Zhang, Z. et al, Optical and Electrical Properties of All-Inorganic Cs2AgBiBr6 Double Perovskite Single Crystals. RSC Adv. 2019, 9 (41), 23459-23464.
44. Zhang, Z., et al. (2019). Stable and highly efficient photocatalysis with lead-free double-perovskite of $Cs_2AgBiBr_6$. Angewandte Chemie International Edition, 58(22), 7263-7267.
45. Zhang, Z., et al. (2020). Towards radiation detection using $Cs_2AgBiBr_6$ double perovskite single crystals. Materials Letters, 269, 127667.
46. Zhou, L., et al. (2018). Synthesis and Photocatalytic Application of Stable Lead-Free $Cs_2AgBiBr_6$ Perovskite Nanocrystals. Small, 14(11), 1703762.

What is claimed is:

1. A Bi-poor perovskite crystal having the formula $Cs_2AgBi_xBr_6$, wherein x is less than 1.

2. An annealed Bi-poor perovskite crystal produced by the process of holding the Bi-poor perovskite crystal of claim 1 at an annealing temperature of between about 25° C. to about 450° C. for a period of from about 1 minute to about 90 days.

3. The Bi-poor perovskite crystal of claim 1, wherein the Bi-poor perovskite crystal comprises a three-dimensional perovskite structure, a low-dimensional perovskite structure, or any combination thereof.

4. The Bi-poor perovskite crystal of claim 1, wherein the Bi-poor perovskite crystal is substantially free of lead, cadmium, thallium, and mercury.

5. The Bi-poor perovskite crystal of claim 2, wherein the Bi-poor perovskite crystal comprises a crystal resistivity of from about $1.0 \times 10^5$ Ω·cm to about $1.0 \times 10^{14}$ Ω·cm.

6. The Bi-poor perovskite crystal of claim 2, wherein the Bi-poor perovskite crystal has a Young's modulus of from about 20 to about 45 GPa.

7. The Bi-poor perovskite crystal of claim 2, wherein the Bi-poor perovskite crystal has a hardness as measured by indentation with a Berkovich tip of from about 0.5 GPa to about 1.5 GPa.

8. A radiation detector comprising:
   (a) the Bi-poor perovskite crystal of claim 2; and
   (b) one or more electrodes in contact with the Bi-poor perovskite crystal.

9. The radiation detector of claim 8, wherein the Bi-poor perovskite crystal comprises a first side and a second side, and the one or more electrodes are in contact with the first side, the second side, or both.

10. The radiation detector of claim 8, wherein the electrodes comprise gold, platinum, silver, gallium, indium, bismuth, nickel, carbon, or any combination thereof.

11. The radiation detector of claim 8, wherein the one or more electrodes comprise one or more bias electrodes and a measurement electrode.

12. A method for detecting radiation comprising:
(a) exposing the radiation detector of claim 8 to radiation and applying a bias voltage to the bias electrodes, wherein the radiation induces an electronic signal in the detector; and
(b) measuring the electronic signal;
wherein, when radiation is present, the electronic signal includes at least one feature that is absent when radiation is absent.

13. The method of claim 12, wherein the bias voltage is from about −10,000 V to about 10,000 V.

14. The method of claim 12, wherein the electronic signal comprises a current, a change of measured current, or both.

15. The method of claim 12, wherein the at least one feature comprises a peak in the energy spectrum located at about 59.5 keV.

16. The method of claim 12, wherein the current from a detector containing an annealed perovskite crystal has an intensity of from about 2× to about 20× an intensity of the current from a detector containing an identical perovskite crystal that has not been annealed, when the same bias voltage is applied.

17. The method of claim 12, wherein the radiation is ionizing radiation.

18. The method of claim 17, wherein the ionizing radiation is X-ray radiation, gamma-ray radiation, alpha radiation, beta radiation, ultraviolet radiation, or any combination thereof.

19. The method of claim 17, wherein the ionizing radiation is emitted from an Am-241 radioactive source, a Na-22 radioactive source, a Cs-137 radioactive source, a Co-57 radioactive source, a Ba-133 radioactive source, a Cd-109 radioactive source, or any combination thereof.

20. The method of claim 12, wherein the radiation is extended UV, visible, or near infra-red (NIR) radiation having a wavelength of from about 310 nm to about 1600 nm.

* * * * *